United States Patent
Suh et al.

(10) Patent No.: US 12,268,041 B2
(45) Date of Patent: Apr. 1, 2025

(54) DISPLAY MODULE AND MANUFACTURING METHOD THEREOF

(71) Applicant: SAMSUNG ELECTRONICS CO., LTD., Suwon-si (KR)

(72) Inventors: Jenghun Suh, Suwon-si (KR); Jihoon Kang, Suwon-si (KR); Myunghee Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 565 days.

(21) Appl. No.: 17/518,092

(22) Filed: Nov. 3, 2021

(65) Prior Publication Data

US 2022/0246672 A1 Aug. 4, 2022

Related U.S. Application Data

(63) Continuation of application No. PCT/KR2021/013792, filed on Oct. 7, 2021.

(30) Foreign Application Priority Data

Feb. 2, 2021 (KR) ........................ 10-2021-0014839

(51) Int. Cl.
*H01L 27/15* (2006.01)
*H01L 33/00* (2010.01)
(Continued)

(52) U.S. Cl.
CPC .......... *H10H 29/142* (2025.01); *H10H 20/01* (2025.01); *H10H 20/814* (2025.01);
(Continued)

(58) Field of Classification Search
CPC ...... H01L 33/502; H01L 27/156; H01L 33/56
See application file for complete search history.

(56) References Cited

U.S. PATENT DOCUMENTS 8,469,530 B2 6/2013 Ito et al.
9,935,153 B1 4/2018 Jung et al.
(Continued)

FOREIGN PATENT DOCUMENTS

CN 111710800 A 9/2020
CN 111725197 A 9/2020
(Continued)

OTHER PUBLICATIONS

International Search Report (PCT/ISA/210) and Written Opinion (PCT/ISA/237) dated Jan. 28, 2022 issued by the International Searching Authority in International Application No. PCT/KR2021/013792.

*Primary Examiner* — Syed I Gheyas
*Assistant Examiner* — Casey Paul Boatman
(74) *Attorney, Agent, or Firm* — Sughrue Mion, PLLC

(57) ABSTRACT

A display module is disclosed. The display module includes pixels provided on the substrate, one of which includes: inorganic light emitting elements configured to emit light of a same color; light dispersing layers provided on light emitting surfaces of the inorganic light emitting elements; color conversion layers provided on the light dispersing layers; and color filters provided on the color conversion layers. When viewed from above an upper surface of the substrate, the light dispersing layers are larger than the inorganic light emitting elements.

15 Claims, 20 Drawing Sheets

(51) Int. Cl.
  *H01L 33/10* (2010.01)
  *H01L 33/50* (2010.01)
  *H01L 33/56* (2010.01)
  *H10H 20/01* (2025.01)
  *H10H 20/814* (2025.01)
  *H10H 20/851* (2025.01)
  *H10H 20/854* (2025.01)
  *H10H 29/14* (2025.01)

(52) U.S. Cl.
  CPC ...... *H10H 20/8512* (2025.01); *H10H 20/854* (2025.01); *H10H 20/0361* (2025.01)

(56) References Cited

U.S. PATENT DOCUMENTS

| | | |
|---|---|---|
| 9,971,198 B2 | 5/2018 | Cho et al. |
| 10,553,653 B2 | 2/2020 | Lee |
| 10,886,260 B2 | 1/2021 | Kuo |
| 11,099,432 B2 | 8/2021 | Lee et al. |
| 11,380,826 B2 | 7/2022 | Achi et al. |
| 11,513,385 B2 | 11/2022 | Park et al. |
| 2010/0163909 A1* | 7/2010 | Chen ............... H01L 33/56 257/E33.059 |
| 2018/0024404 A1* | 1/2018 | Suzuki ............... H10K 59/877 362/84 |
| 2018/0120646 A1 | 5/2018 | Lee et al. |
| 2019/0115508 A1* | 4/2019 | Lin ................... H01L 31/02325 |
| 2019/0189858 A1 | 6/2019 | Li et al. |
| 2020/0081292 A1 | 3/2020 | Park et al. |
| 2020/0083198 A1 | 3/2020 | Kuo |
| 2020/0176650 A1 | 6/2020 | Achi et al. |
| 2020/0343315 A1* | 10/2020 | Lin .................. H10K 59/38 |
| 2021/0217739 A1 | 7/2021 | Lee et al. |
| 2021/0288105 A1* | 9/2021 | Kawanishi .......... H01L 25/0753 |
| 2022/0293833 A1 | 9/2022 | Achi et al. |

FOREIGN PATENT DOCUMENTS

| | | |
|---|---|---|
| JP | 2009283438 A | 12/2009 |
| JP | 6753452 B2 | 9/2020 |
| KR | 1020140074495 A | 6/2014 |
| KR | 1020180049462 A | 5/2018 |
| KR | 1020190033816 A | 4/2019 |
| KR | 10-2020-0027136 A | 3/2020 |
| KR | 10-2020-0030147 A | 3/2020 |
| KR | 1020200029350 A | 3/2020 |
| KR | 1020200083879 A | 7/2020 |

* cited by examiner

DISPLAY MODULE AND MANUFACTURING METHOD THEREOF

CROSS-REFERENCE TO RELATED APPLICATIONS

This application is a bypass continuation of International Application No. PCT/KR2021/013792, filed on Oct. 7, 2021, which is based on and claims priority to Korean Patent Application No. 10-2021-0014839, filed on Feb. 2, 2021, in the Korean Intellectual Property Office, the disclosures of which are incorporated by reference herein in their entireties.

BACKGROUND

Field

The disclosure relates to a display module that uses self-luminescence elements for displaying images, and a method for manufacturing thereof.

Description of Related Art

Self-luminescence elements in a display panel may be used to display images without a backlight. A display panel expresses various colors as it operates in groups of pixels or sub-pixels consisting of self-luminescence elements. The operation of each pixel or sub-pixel is controlled by a thin film transistor (TFT).

In a related display panel that uses self-luminescence elements, there is a problem that irregular luminance occurs within subpixels. The irregular luminance is caused by light emitted from self-luminescence elements being concentrated on locations where the self-luminescence elements are arranged in sub-pixel areas which are relatively large compared to the self-luminescence elements.

Also, partial degradation occurs in areas where light of self-luminescence elements are concentrated in sub-pixel areas when quantum dots are applied to pixels.

SUMMARY

Therefore, these is a need for a display module that emits light from self-luminescence elements uniformly dispersed in sub-pixel areas and thereby reduces luminance irregularities within the sub-pixel areas, and prevents partial degradation in areas wherein light are concentrated within the sub-pixel areas, and a method for manufacturing thereof.

According to embodiments of the disclosure, a display module includes: a substrate; and a plurality of pixels provided on the substrate. A first pixel of the plurality of pixels includes: a first inorganic light emitting element, a second inorganic light emitting element and a third inorganic light emitting element, each of the first inorganic light emitting element, the second inorganic light emitting element and the third inorganic light emitting element being configured to emit light of a same color; a first light dispersing layer provided on a light emitting surface of the first inorganic light emitting element, a second light dispersing layer provided on a light emitting surface of the second inorganic light emitting element and a third light dispersing layer provided on a light emitting surface of the third inorganic light emitting element; a first color conversion layer provided on the first light dispersing layer and a second color conversion layer provided on the second light dispersing layer; and a first color filter provided on the first color conversion layer and a second color filter provided on the second color conversion layer. When viewed from above an upper surface of the substrate, the first light dispersing layer is larger than the first inorganic light emitting element, the second light dispersing layer is larger than the second inorganic light emitting element and the third light dispersing layer is larger than the third light emitting element.

When viewed from above the upper surface of the substrate, the first light dispersing layer and the first color conversion layer may have a same size, and the second light dispersing layer and the second color conversion layer may have a same size.

Each of the first light dispersing layer, the second light dispersing layer and the third light dispersing layer may include a light scattering material mixed with a transparent resin.

The transparent resin may be a silicone or an epoxy-based compound.

The light scattering material may be $TiO_2$, $SiO_2$ or a glass bead.

When viewed from above the upper surface of the substrate, a center of the first inorganic light emitting element may correspond to a center of the first light dispersing layer, a center of the second inorganic light emitting element may correspond to a center of the second light dispersing layer, and a center of the third inorganic light emitting element may correspond to a center of the third light dispersing layer.

When viewed from above the upper surface of the substrate, a center of the first inorganic light emitting element may be offset from a center of the first light dispersing layer, a center of the second inorganic light emitting element may be offset from a center of the second light dispersing layer and a center of the third inorganic light emitting element may be offset from a center of the third light dispersing layer.

Each of the first inorganic light emitting element, the second inorganic light emitting element and the third inorganic light emitting element may be a Blue Micro Light Emitting Diode (LED).

When viewed from above the upper surface of the substrate, the first light dispersing layer and the first color conversion layer may have a same size, and the second light dispersing layer and the second color conversion layer may have a same size.

A partition wall may be provided between the first inorganic light emitting element, the second inorganic light emitting element and the third inorganic light emitting element, and the partition wall may be configured to reflect light emitted from each of the first light dispersing layer, the second light dispersing layer and the third light dispersing layer, and from a side surface of each of the first color conversion layer and the second color conversion layer.

A metal film may be formed on a surface of the partition wall.

An optical adhesive may be provided between a side surface of the first inorganic light emitting element and the partition wall, between a side surface of the second inorganic light emitting element and the partition wall, and between the third inorganic light emitting element and the partition wall.

Each of a portion of the first light dispersing layer adjacent the first inorganic light emitting element, a portion of the second light dispersing layer adjacent the second inorganic light emitting element and a portion the third light dispersing layer adjacent the third inorganic light emitting element may be in direct contact with the optical adhesive.

Each of the first inorganic light emitting element, the second inorganic light emitting element and the third inorganic light emitting element may be an Ultraviolet Micro Light Emitting Diodes (UV LEDs), and the display module may further include: a third color conversion layer provided on the third light dispersing layer; a third color filter provided on the third color conversion layer; and an Ultraviolet (UV) block filter provided on the first color filter, the second color filter and the third color filter.

According to embodiments of the disclosure, a method of manufacturing a display module includes; sequentially forming a color filter, a planarization layer and a color conversion layer on a first substrate to generate a first portion of the display module; providing a plurality of inorganic light emitting elements on a second substrate to generate a second portion of the display module; aligning the color conversion layer of the first portion and the plurality of inorganic light emitting elements of the second portion; and bonding the first portion and the second portion.

The method may further include: forming a black matrix on the first substrate in a form of mesh; forming the color filter on the first substrate; forming the planarization layer on the color filter; forming a partition wall to define sub-pixel areas on the planarization layer; and forming the color conversion layer in a first plurality of the sub-pixel areas; forming a transparent resin layer in a second plurality of the sub-pixel areas; and forming a light dispersing layer on the color conversion layer and the transparent resin layer.

According to embodiments of the disclosure, a display device includes: a substrate; and a plurality of pixels provided on an upper surface of the substrate. A first pixel of the plurality of pixels includes: a first light emitting element configured to emit light of a first color; a first light dispersing layer provided on the first light emitting element; a first color conversion layer provided on the first light dispersing layer; a second light emitting element configured to emit light of the first color; a second light dispersing layer provided on the second light emitting element; and a second color conversion layer provided on the second light dispersing layer. A sidewall of the first light dispersing layer and a sidewall of the first color conversion layer are coplanar, and a sidewall of the second light dispersing layer and a sidewall of the second color conversion layer are coplanar.

The display device may further include a partition wall provided between the first light dispersing layer and the second light dispersing layer, and between the first color conversion layer and the second conversion layer.

A sidewall of the partition wall may directly contact the sidewall of the first light dispersing layer, the sidewall of the first color conversion layer, the sidewall of the second light dispersing layer and the sidewall of the second color conversion layer.

A metal film may be provided on a sidewall of the partition wall, and the metal film may directly contact the sidewall of the first light dispersing layer and the sidewall of the first color conversion layer.

The display device may further include an optical adhesive that is provided between the first light emitting element and the partition wall, and between the first light dispersing layer and the substrate.

The display device may further include an anisotropic conductive film provided between the substrate and the first light emitting element, and between the substrate and the second light emitting element.

The anisotropic conductive film may include a plurality of conductive balls which electrically connect the first light emitting element and the second light emitting element to electrode pads provided on the upper surface of the substrate.

The display device may further include a plurality of side surface wirings provided on the substrate which electrically connect the electrode pads to driving circuits provided on a lower surface of the substrate.

The display device may further include: a first color filter provided on the first color conversion layer; a second color filter provided on the second color conversion layer; and a black matrix provided between the first color filter and the second color filter.

The first color conversion layer may include a plurality of first quantum dots configured to emit light of a first sub-pixel color, and the second color conversion layer may include a plurality of second quantum dots configured to emit light of a second sub-pixel color.

The first color, the first sub-pixel color and the second sub-pixel color may be different from each other.

DETAILED DESCRIPTION

Figure 1:
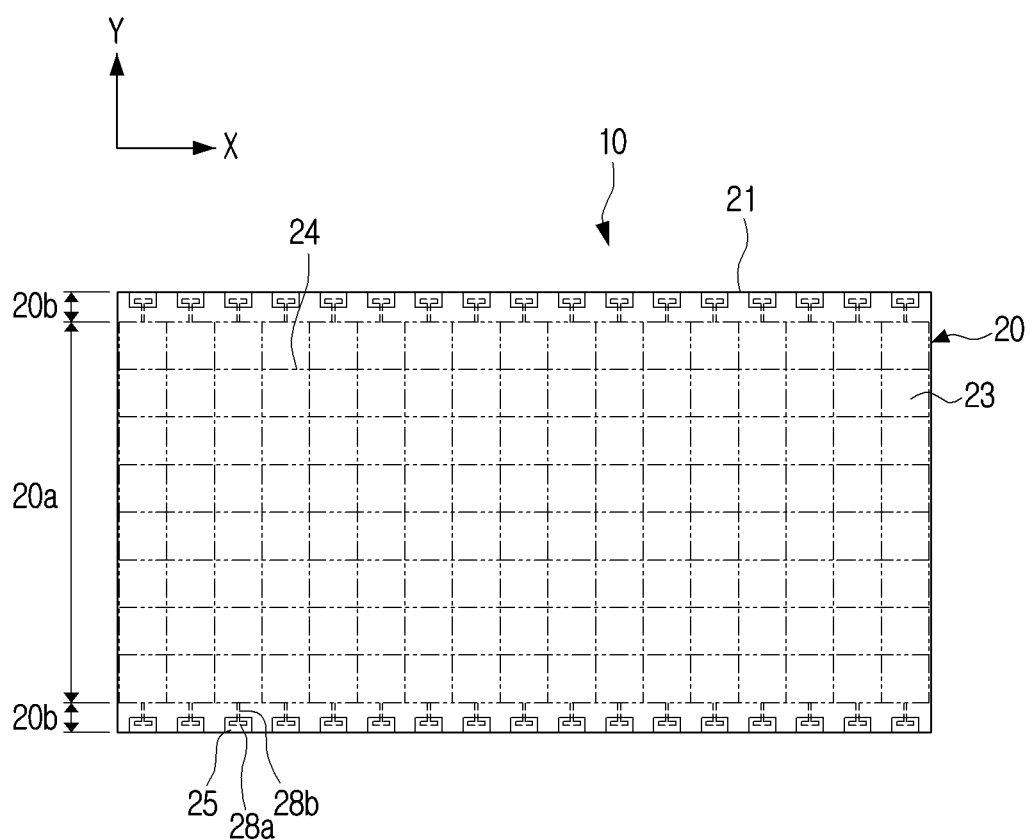
FIG. 1 is a schematic front view illustrating a display module according to an embodiment.

Hereinafter, various embodiments will be described in more detail with reference to the accompanying drawings. The embodiments described in this specification may be modified in various ways. Also, specific embodiments may be illustrated in the drawings, and described in detail in the detailed description. However, specific embodiments disclosed in the accompanying drawings are for making the various embodiments easily understood. Accordingly, the technical idea of the disclosure is not restricted by the specific embodiments disclosed in the accompanying drawings, and the embodiments should be understood as including all equivalents or alternatives included in the idea and the technical scope of the disclosure.

As used herein, the terms "1st" or "first" and "2nd" or "second" may use corresponding components regardless of importance or order and are used to distinguish a component from another without limiting the components. Further, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Also, terms such as "include" and "have" should be construed as designating that there are such characteristics, numbers, steps, operations, elements, components or a combination thereof described in the specification, but not as excluding in advance the existence or possibility of adding one or more of other characteristics, numbers, steps, operations, elements, components or a combination thereof. In addition, the description that one element is "coupled to" or "connected to" another element should be interpreted to include both the case wherein one element is directly coupled to or connected to another element and the case wherein there is another element between the elements. In contrast, the description that one element is "directly coupled" or "directly connected" to another element should be interpreted to indicate that another element does not exist between the elements.

Further, the term "identical" not only indicates that two components perfectly coincide with each other, but also indicates that a difference to a degree in consideration of a processing tolerance range is included.

In addition to the above, in describing the disclosure, in case it is determined that detailed explanation of related known functions or components may unnecessarily confuse the gist of the disclosure, the detailed explanation will be abridged or omitted.

A display module may be a display panel including micro light emitting diodes which are self-luminescence elements for displaying images. A display module may be a flat display panel, may include a plurality of inorganic LEDs each of which is equal to or smaller than 100µm, and may provide better contrast, response time, and energy efficiency than a liquid crystal display (LCD) panel which needs a backlight. In a display module, micro light emitting diodes used for displaying images are self-luminescence elements, and thus there is no need to include a separate backlight.

Organic LEDs and micro LEDs which are inorganic LEDs have good energy efficiency. Micro LEDs may have better brightness and light emitting efficiency, and a longer lifespan than OLEDs. Micro LEDs may be a semiconductor chip that can emit light by itself when power is supplied. Micro LEDs have fast response speed, low power consumption, and high luminance. For example, micro LEDs have higher efficiency in converting electricity into photons than a liquid crystal display (LCD) or organic light emitting diodes (OLEDs). That is, micro LEDs have higher "brightness per watt" than a related LCD or OLED display. Accordingly, micro LEDs can exert identical brightness with about half the energy compared to larger LEDs (of which length, width, and height respectively exceed 100 m) or OLEDs. Micro LEDs can implement high resolution, excellent colors, contrast, and brightness, and thus they can express colors in a wide range correctly, and can implement a clear screen outdoors. Also, micro LEDs are resistant to a burn-in phenomenon and generate little heat, and thus may provide a long lifespan without distortion. Micro LEDs may have a flip chip structure wherein an anode electrode and a cathode electrode are formed on the same first surface, and a light emitting surface is formed on a second surface positioned on the opposite side of the first surface wherein the electrodes are formed.

One pixel may include multiple sub-pixels. For example, one pixel may include at least three sub-pixels. One sub-pixel is a micro self-luminescence element for displaying images, and for example, it may indicate a micro light emitting diode (LED), a blue micro light emitting diode (LED), or an ultraviolet (UV) micro light emitting diode (LED). Here, a blue micro LED may be a self-luminescence element that emits light of a blue wavelength band (450-490 nm), and a UV micro LED may be a self-luminescence element that emits light of a ultraviolet wavelength band (360-410 nm).

One sub-pixel may include one micro self-luminescence element, and a color conversion layer and a color filter corresponding thereto. The color conversion layer may be excited by light emitted from the micro self-luminescence element, and emit a color of a specific wavelength band. The color conversion layer may consist of a material including a nano fluorescent body or quantum dots.

One sub-pixel area indicates an area wherein the color of the one sub-pixel is expressed by light emitted from the sub-pixel. The area (i.e., the horizontal length multiplied by the vertical length) of one surface of a color conversion layer to which a sub-pixel corresponds may be bigger than the area of the light emitting surface of the sub-pixel. In this case, the sub-pixel area may correspond to the area of the color conversion layer. Between the color conversion layer and the sub-pixel, a light dispersing layer having an area corresponding to the area of the color conversion layer may be disposed. The light dispersing layer may uniformly disperse the light emitted from the sub-pixel to the entire color conversion layer. Accordingly, luminance irregularities within the sub-pixel area can be reduced, and partial degradation in an area wherein light are concentrated within the sub-pixel area can be prevented.

A thin film transistor (TFT) layer wherein a TFT circuit is formed may be disposed on a front surface of a substrate, and on a rear surface, a power supply circuit that supplies power to the TFT circuit, and a data driving driver, a gate driving driver, and a timing controller controlling each driving driver may be disposed. A plurality of pixels arranged on the TFT layer may be driven by the TFT circuit.

As a substrate, a glass substrate, a substrate made of a synthetic resin (e.g., polyimide (PT), polyethylene terephthalate (PET), polyethersulfone (PES), polyethylene naphthalate (PEN), polycarbonate (PC), etc.), or a ceramic substrate may be used.

A TFT layer wherein a TFT circuit is formed may be disposed on a front surface of a substrate, and a circuit may not be disposed on a rear surface of the substrate. A TFT layer may be integrally formed on a substrate, or manufactured in the form of a separate film and attached on one surface of a glass substrate.

A front surface of a substrate may be divided into an active area and a dummy area. The active area may be an area occupied by the TFT layer on the front surface of the substrate, and the dummy area may be an area excluding the area occupied by the TFT layer on the front surface of the substrate.

An edge area of a substrate may be an outermost area of a glass substrate. Also, an edge area of a substrate may be the remaining area excluding an area wherein a circuit of the substrate is formed. Further, an edge area of a substrate may include a part of the front surface of the substrate adjacent to the side surface of the substrate and a part of the rear surface of the substrate adjacent to the side surface of the substrate. A substrate may be formed as a quadrangle type. Specifically, a substrate may be formed as a rectangle or a square. An edge area of a substrate may include at least one side among four sides of a glass substrate.

A TFT constituting a TFT layer (or a backplane) is not limited to a specific structure or type. For example, a TFT may be implemented as an oxide TFT and an Si TFT (polysilicon, a-silicon), an organic TFT, a graphene TFT, etc., other than a low-temperature polycrystalline silicon (LTPS) TFT, and only a P-type (or an N-type) MOSFET is made in an Si wafer CMOS process and applied.

A method of driving pixels of a display module may be an active matrix (AM) driving method or a passive matrix (PM) driving method. A display module may form a pattern of wiring wherein each micro LED is electronically connected according to an AM driving method or a PM driving method.

In one pixel area, a plurality of pulse amplitude modulation (PAM) control circuits may be disposed. In this case, each sub-pixel disposed in the one pixel area may be controlled by a corresponding PAM control circuit. Also, in one pixel area, a plurality of pulse width modulation (PWM) control circuits may be disposed. In this case, each sub-pixel disposed in the one pixel area may be controlled by a corresponding PWM control circuit.

In one pixel area, a plurality of PAM control circuits and a plurality of PWM control circuits may be disposed together. In this case, some of sub-pixels disposed in the one pixel area may be controlled by the PAM control circuits, and the remaining sub-pixels may be controlled by the PWM control circuits. Also, each sub-pixel may be controlled by the PAM control circuits and the PWM control circuits.

A display module may include a plurality of side surface wirings having a thin film thickness that are disposed at regular intervals along the side surface of a TFT substrate.

In a display module, a plurality of penetrating wiring members formed to be not exposed on the side surface of a TFT substrate may be provided instead of side surface wirings that are exposed on the side surface of a TFT substrate. Accordingly, a dummy area is minimized on the front surface of the TFT substrate, and an active area is maximized, and thus the display module may become bezel-less, and the density of micro LEDs for the display module can be increased.

A plurality of display modules implementing a bezel-less structure may be connected to form a multi-display device in a large size that can maximize an active area can be provided. In this case, as a dummy area in each display module is minimized, pitches among each pixel of display modules adjacent to each other may be formed to be maintained to be identical to the pitches among each pixel in a single display module. Accordingly, seams between adjacent display modules may be invisible in connecting portions among each display module.

A driving circuit may be disposed in a pixel area and implemented by a micro IC that controls the driving of at least 2n pixels, where n is a positive integer. In case a micro IC is applied to a display module, only a channel layer connecting the micro IC and each micro LED may be formed, and a TFT on a TFT layer (or a backplane) may be omitted.

A display module may be installed and applied in a single unit on a wearable device, a portable device, a handheld device, and an electronic product or an electronic device that needs various kinds of displays, and it may also be applied to a display device such as a monitor for a personal computer (PC), a high-resolution TV and signage (or, digital signage), an electronic display, etc., as a matrix type through a plurality of assembly arrangements.

Hereinafter, a display module according to an embodiment will be described with reference to the drawings.

Figure 2:
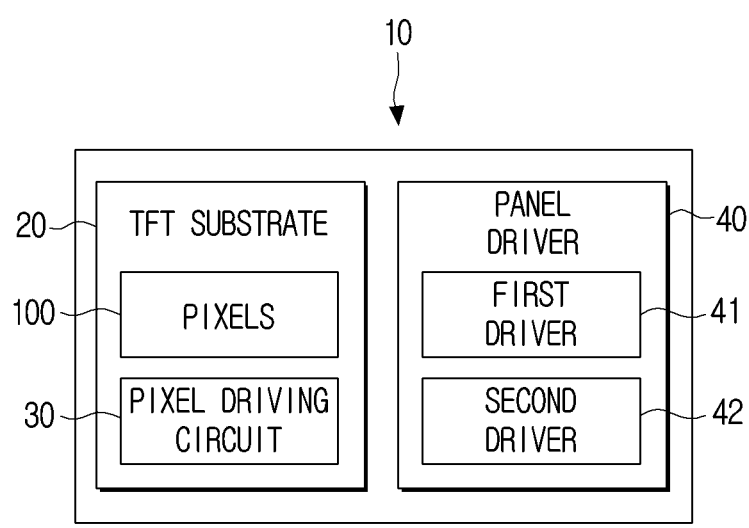
FIG. 2 is a schematic block diagram illustrating a display module according to an embodiment.

FIG. 1 is a schematic front view illustrating a display module according to an embodiment, and FIG. 2 is a schematic block diagram illustrating a display module according to an embodiment.

Referring to FIG. 1 and FIG. 2, a display module 10 may include a TFT substrate 20 wherein a plurality of pixel driving circuits 30 are formed, a plurality of pixels 100 arranged on the front surface of the TFT substrate 20, and a panel driver 40 that generates a control signal and provides the generated control signal to the plurality of pixel driving circuits 30.

One pixel may include a plurality of sub-pixels. Also, one sub-pixel may include one light source and a color conversion layer and a color filter corresponding to each light source. For example, a single pixel that includes three sub-pixels may include three light sources, three color conversion layers and three color filters. Here, a light source is an inorganic self-light emitting diode, and for example, it may be a vertical cavity surface emitting laser (VCSEL) diode having a size of equal to or smaller than 100 μm (preferably, equal to or greater than 30 μm) or a micro light emitting diode (LED). A VCSEL diode and a micro LED may emit light of a blue wavelength band (450-490 nm) or light of an ultraviolet wavelength band (360-410 nm). The structure of the pixels 100 will be described in detail below with reference to FIG. 3.

The TFT substrate 20 may include a glass substrate 21, a TFT layer 23 including a thin film transistor (TFT) circuit on the front surface of the glass substrate 21, and a plurality of side surface wirings 25 that electronically connect the TFT circuit of the TFT layer 23 and circuits disposed on the rear surface of the glass substrate.

As an alternative of the glass substrate 21, a substrate made of a synthetic resin that has a flexible material (e.g., polyimide (PI), polyethylene terephthalate (PET), polyethersulfone (PES), polyethylene naphthalate (PEN), polycarbonate (PC), etc.), or a ceramic substrate may be used.

The TFT substrate 20 may include an active area 20a which can emit light to express images on the front surface, and a dummy area 20b that does not emit light, and therefore cannot express images.

The active area 20a may be partitioned into a plurality of pixel areas 24 wherein each of a plurality of pixels is arranged. The plurality of pixel areas 24 may be partitioned into various forms, and as an example, they may be partitioned into a matrix form. In one pixel area 24, one pixel 100 (refer to FIG. 3) may be included.

The dummy area 20b may be included in an edge area of a glass substrate, and a plurality of connection pads 28a disposed at regular intervals may be formed along the edge area. Each of the plurality of connection pads 28a may be electronically connected with each pixel driving circuit 30 through a wiring 28b.

The number of the connection pads 28a formed in the dummy area 20b may vary according to the number of pixels implemented in the glass substrate, and it may also vary according to the driving method of the TFT circuit disposed in the active area 20a. For example, compared to the case of a passive matrix (PM) driving method wherein the TFT circuit disposed in the active area 20a drives a plurality of pixels in a horizontal line and a vertical line, an active matrix (AM) driving method of independently driving each pixel may need more wirings and connection pads.

The TFT layer 23 may include a plurality of data signal lines disposed horizontally for controlling the plurality of pixels 100, a plurality of gate signal lines disposed vertically, and a plurality of pixel driving circuits 30 electronically connected with each line.

The panel driver 40 may be directly connected with the substrate by a chip on glass (COG) or chip on plastic (COP) bonding method, or indirectly connected with the TFT substrate 20 through a separate FPCB by a film on glass (FOG) bonding method. The panel driver 40 may drive the plurality of pixel driving circuits 30, and control light emission of a plurality of micro LEDs electronically connected with each of the plurality of pixel driving circuits 30.

The panel driver 40 may control the plurality of pixel driving circuits 30 by each line through a first driver 41 and a second driver 42. The first driver 41 may generate a control signal for sequentially controlling a plurality of horizontal lines formed on the TFT substrate 20 by one line per image frame, and transmit the generated control signal to the pixel driving circuits 30 respectively connected with the lines. The second driver 42 may generate a control signal for sequentially controlling a plurality of vertical lines formed on the TFT substrate 20 by one line per image frame, and transmit the generated control signal to the pixel driving circuits 30 respectively connected with the lines.

Figure 3:
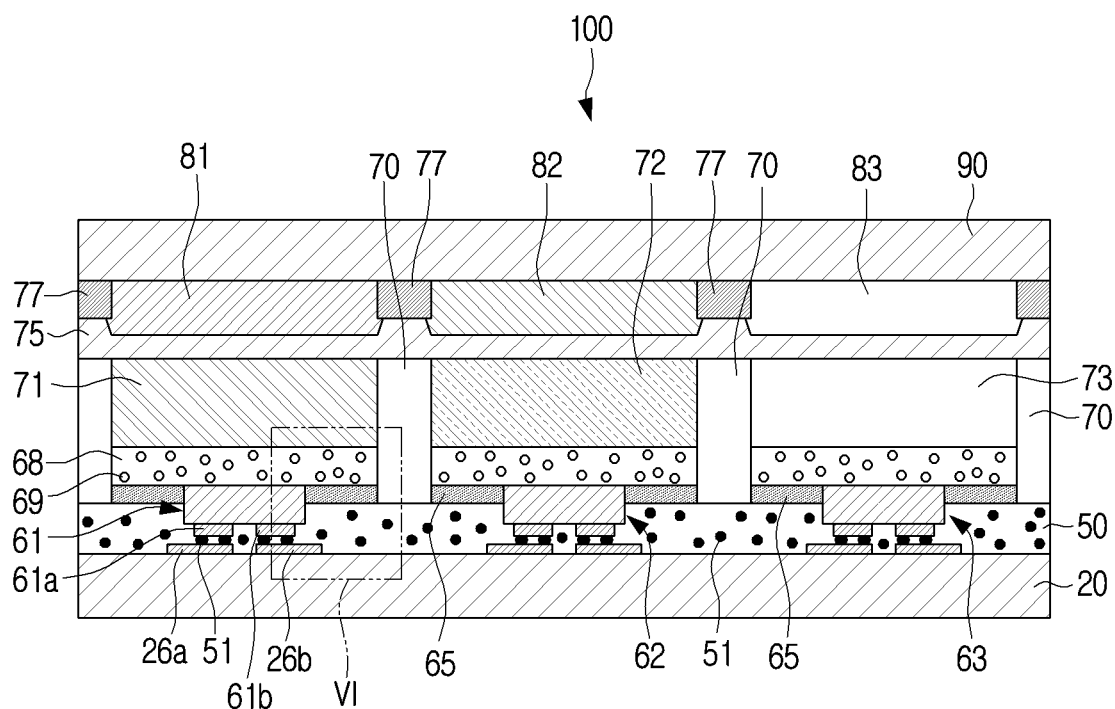
FIG. 3 is a cross-sectional view illustrating a single pixel of a display module according to an embodiment.
Figure 4A:
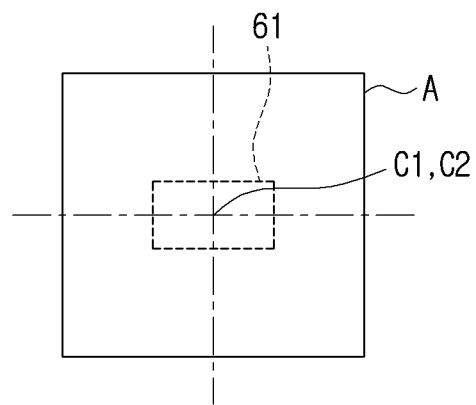
FIG. 4A is a diagram illustrating an embodiment wherein a self-luminescence element is disposed at a position centered on the center of a sub-pixel area within the sub-pixel area.
Figure 4B:
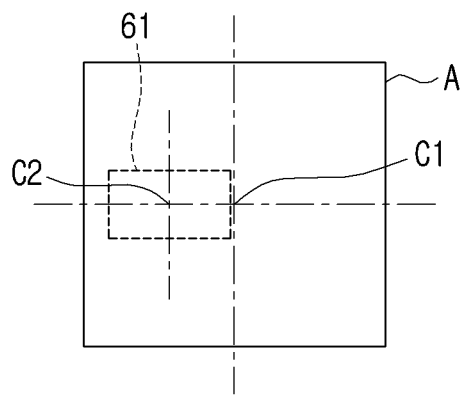
FIG. 4B is a diagram illustrating an embodiment wherein a self-luminescence element is disposed at a position eccentric to the left side from the center of a sub-pixel area within the sub-pixel area.
Figure 4C:
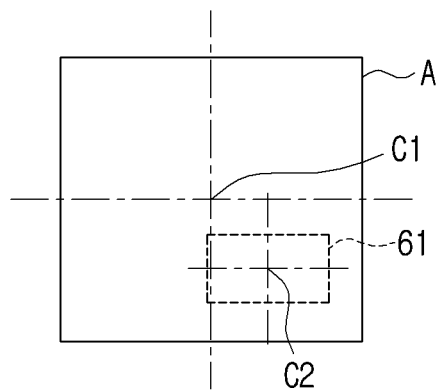
FIG. 4C is a diagram illustrating an embodiment wherein a self-luminescence element is disposed at a position eccentric to the corner side from the center of a sub-pixel area within the sub-pixel area.
Figure 5:
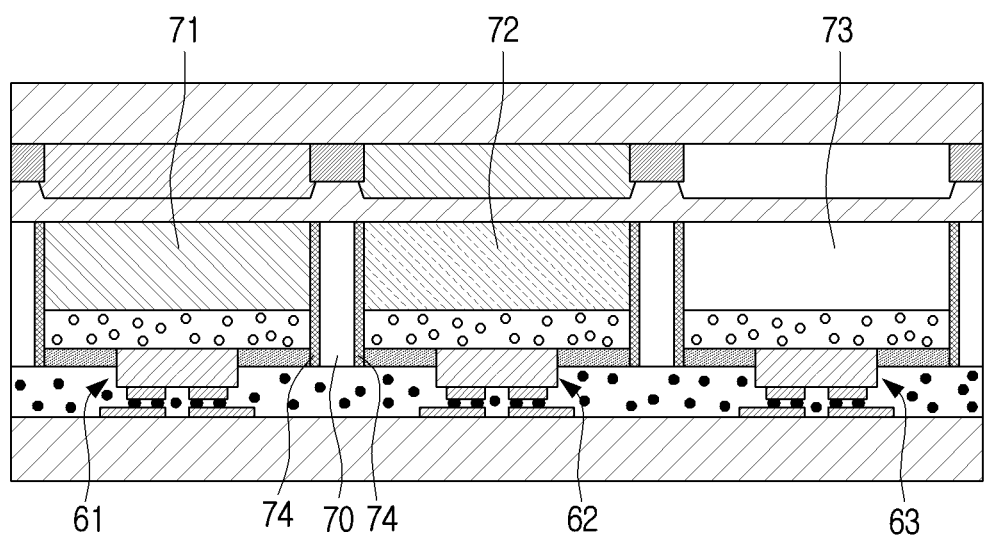
FIG. 5 is a cross-sectional view illustrating an embodiment wherein a metal film is formed on a side surface of a partition wall.
Figure 6:
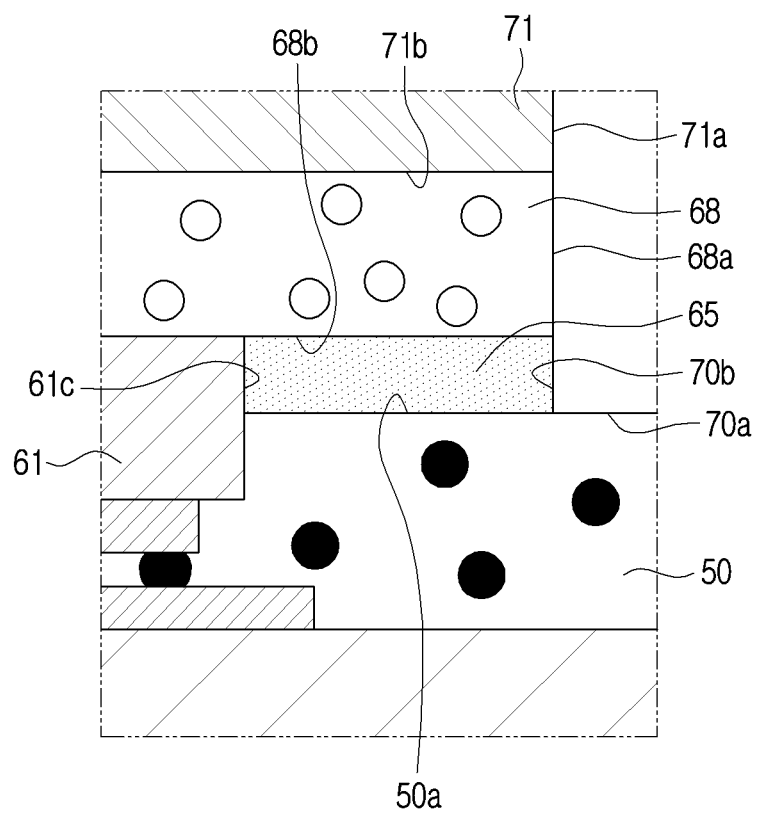
FIG. 6 is a diagram which enlarged the VI portion indicated in FIG. 3.

FIG. 3 is a cross-sectional view illustrating a single pixel of a display module according to an embodiment, FIG. 4A to FIG. 4C are diagrams illustrating various arrangements of micro LEDs within a sub-pixel area, FIG. 5 is a cross-sectional view illustrating an embodiment wherein a metal film is formed on a side surface of a partition wall, and FIG. 6 is a diagram which enlarged the VI portion indicated in FIG. 3.

Referring to FIG. 3, one pixel 100 may be included in one pixel area 24 (refer to FIG. 1).

The pixel 100 may include at least three micro LEDs 61, 62, 63 that emit light of the same color, for example, light of the blue wavelength band (450-490 nm).

The first to third micro LEDs 61, 62, 63 may be electronically and physically connected with the TFT substrate 20 through an anisotropic conductive film (ACF) 50 laminated on the front surface of the TFT substrate 20.

The anisotropic conductive film 50 includes a thermosetting resin (e.g., an epoxy resin, a polyurethane resin, an acryl resin, etc.) and a plurality of conductive balls 51 having a micro diameter (e.g., 3-15 m) inside the thermosetting resin. Each conductive ball 51 may include polymer particles and a conductive film such as Au, Ni, Pd, etc., coated on the surfaces of the polymer particles. The anisotropic conductive film 50 has conductivity in a compressing direction, and has an insulating property in a vertical direction of the compressing direction.

The first to third micro LEDs 61, 62, 63 may have a flip chip structure wherein two chip electrodes 61a, 61b, which are an anode electrode and a cathode electrode, are formed on the opposite side of the light emitting surface. The first and second chip electrodes 61a, 61b may consist of any one of Al, Ti, Cr, Ni, Pd, Ag, Ge, or Au, or an alloy thereof.

When the first to third micro LEDs 61, 62, 63 are transferred to the TFT substrate 20, they are seated on the surface of the anisotropic conductive film 50 attached on the TFT substrate 20. Then, through a thermo-compressing process, the first to third micro LEDs 61, 62, 63 are inserted into the inside of the anisotropic conductive film 50 to a predetermined depth. Accordingly, the first to third micro LEDs 61, 62, 63 may be physically fixed on the TFT substrate 20 by the anisotropic conductive film 50.

Also, as the first micro LED 61 is pressurized toward the TFT substrate 20 by the thermo-compressing process, the chip electrodes 61a, 61b of the first micro LED 61 may be positioned to be adjacent to the substrate electrode pads 26a, 26b. In this case, the chip electrodes 61a, 61b of the first micro LED 61 may be electronically connected with the substrate electrode pads 26a, 26b by the conductive balls 51 positioned between the chip electrodes 61a, 61b of the first micro LED 61 and the substrate electrode pads 26a, 26b. Likewise, the second and third micro LEDs 62, 63 may also be electronically connected with the substrate electrode pads corresponding to each chip electrode through the conductive balls 51 in the same manner as the first micro LED 61.

Referring to FIG. 3, in the pixel 100, a light dispersing layer 68 corresponding to the light emitting surfaces of the first to third micro LEDs 61, 62, 63 may be disposed.

The light dispersing layer 68 may include, for example, a transparent resin and a light scattering material 69 mixed inside the transparent resin. The transparent resin may be a silicone or an epoxy-based compound. The light scattering material 69 may be $TiO_2$, $SiO_2$ or a glass bead. The light scattering material 69 may be, for example, particles dispersed in the transparent resin as in FIG. 3.

The area (the horizontal length multiplied by the vertical length) of the light dispersing layer 68 may be formed to be bigger than the areas of the light emitting surfaces of the first to third micro LEDs 61, 62, 63. In this case, it may indicate that the size of the light dispersing layer is bigger than the sizes of the first to third micro LEDs 61, 62, 63.

Also, the area of the light dispersing layer 68 may be formed to be identical to the areas of the first and second color conversion layers 71, 72, and the area of a first transparent resin layer 73. In this case, the area of the light dispersing layer 68 or the areas of the first and second color conversion layers 71, 72 and the first transparent resin layer 73 may be identical to the sub-pixel area. Like this, the sub-pixel area is designed to be bigger than the sizes of micro LEDs for securing process tolerance.

Light respectively emitted from the first to third micro LEDs 61, 62, 63 is absorbed into the light dispersing layer 68, and then evenly dispersed to the entire light dispersing layer 68 by a light dispersing material, and then emitted to the first and second color conversion layers 71, 72 and the first transparent resin layer 73. Accordingly, even if the sub-pixel area is bigger than the sizes of the first to third micro LEDs 61, 62, 63 for securing process tolerance, as light is evenly dispersed to the entire sub-pixel area through the light dispersing layer 68, luminance irregularities within the sub-pixel area can be reduced, and partial degradation in an area wherein light is concentrated within the sub-pixel area can be prevented.

FIG. 4A to FIG. 4C are diagrams illustrating various arrangements of a micro LED within a sub-pixel area.

The first micro LED 61 may be disposed at a position wherein the center C2 of the first micro LED 61 is coincident with the center C1 of the sub-pixel area A as in FIG. 4A. In this case, light emitted from the first micro LED 61 is dispersed by the light dispersing layer 68 having a bigger area than the area of the light emitting surface of the first micro LED 61, and is evenly emitted to the entire first color conversion layer 71.

Also, the first micro LED 61 may be disposed at a position wherein the center C2 of the first micro LED 61 moved from the center C1 of the sub-pixel area A as much as a specific distance to the left side as in FIG. 4B. Additionally, the first micro LED 61 may be disposed at a position wherein its center C2 moved from the center C1 of the sub-pixel area A as much as a specific distance to the right side, the upper side, or the lower side. In this case, light emitted from the first micro LED 61 may be dispersed by the light dispersing layer 68 and evenly emitted to the entire first color conversion layer 71.

In addition, the first micro LED 61 may be disposed at a position wherein the center C2 of the first micro LED 61 moved from the center C1 of the sub-pixel area A as much as a specific distance to be adjacent to the corner on the right-down side as in FIG. 4C. Additionally, the first micro LED 61 may be disposed such that its center C2 is adjacent to any one of the remaining three corners of the sub-pixel area A. In this case, light emitted from the first micro LED 61 may also be dispersed by the light dispersing layer 68 and evenly emitted to the entire first color conversion layer 71.

The first and second color conversion layers 71, 72 may include nano fluorescent bodies which absorb light emitted from the first and second micro LEDs 61, 62, and convert the light into light of different wavelength bands from one another and emit the light. Nano fluorescent bodies exhibit different physical properties compared to larger fluorescent bodies of which particle diameters are a few μm. For example, as a gap of an energy band which is a quantum-state energy level structure of electrons inside crystals of a nano fluorescent body increases, the nano fluorescent body has energy wherein the wavelength of the emitted light increases, and thus light emitting efficiency can be improved. In a nano fluorescent body, the particle density of the fluorescent body increases compared to a fluorescent body wherein the applied area has a bulk structure, and accordingly, colliding electrons effectively contribute to light emission, and thus the efficiency of the display can be improved.

The first color conversion layer 71 may include a red nano fluorescent body that is excited by light of a blue wavelength band emitted from the first micro LED 61, and can emit light of a red wavelength band. For example, the red nano fluorescent body may be SCASN($Si_{1-x}Ca_xAlSiN_3$:$Eu^{2+}$). In this case, the particle size distribution average value (d50) of the red nano fluorescent body may be smaller than 0.5 μm (preferably, 0.1 μm<d50<0.5 μm).

The second color conversion layer 72 may include a green nano fluorescent body that is excited by light of a blue wavelength band emitted from the second micro LED 62, and can emit light of a green wavelength band. For example, the green nano fluorescent body may be β-SiAlON($Si_{6-z}Al_zO_zN_{8-z}$:$Eu^{2+}$) or $SrGa_2S_4$. In this case, the particle size distribution average value (d50) of the green nano fluorescent body may be smaller than 0.5 μm (preferably, 0.1 μm<d50<0.5 μm).

The first color conversion layer 71 may consist of a material including red quantum dots that emits light of a red wavelength band as an alternative of the red nano fluorescent body. In this case, the second color conversion layer 72 may consist of a material including green quantum dots that emits light of a green wavelength band as an alternative of the green nano fluorescent body.

The first transparent resin layer 73 may consist of a material that does not influence, or minimally influences, the transmittance, the reflectance, and the refractive index of light emitted from the light dispersing layer 68. According to embodiments, the first transparent resin layer 73 can be omitted, and an air layer may be provided on the light emitting surface side of the third micro LED 63.

Also, the pixel 100 may include first and second color filters 81, 82 that respectively correspond to the first and second color conversion layers 71, 72, and include a second transparent resin layer 83 corresponding to the first transparent resin layer 73.

The first color filter 81 may be a red color filter that allows a wavelength of a color identical to the color of the light of the red wavelength band emitted from the first color conversion layer 71 pass through. The second color filter 82 may be a green color filter that allows a wavelength of a color identical to the color of the light of the green wavelength band emitted from the second color conversion layer 72 pass through.

The second transparent resin layer 83 may consist of a material that does not influence, or minimally influences, the transmittance, the reflectance, and the refractive index of light that passed through the first transparent resin layer 73. Also, the second transparent resin layer 83 may be an optical film that directs light toward the front surface thereof through refraction and reflection and thereby minimizes wasted light, and that can improve luminance.

The first to third micro LEDs 61, 62, 63 may be constituted as squares having a specific thickness and of which width and length are identical, or as rectangles having the specific thickness and of which width and length are different. Such micro LEDs can implement a real high dynamic range (HDR), and can improve luminance and expression of a black color compared to OLEDs, and can provide a high contrast ratio. The sizes of the micro LEDs may be equal to or smaller than 100 μm, and preferably, equal to or smaller than 30 μm.

Referring to FIG. 3, in the pixel 100, the light emitting areas of the first to third micro LEDs 61, 62, 63 may be partitioned by a partition wall 70. The partition wall 70 may be formed of an approximately lattice shape. Each of the plurality of light emitting areas partitioned by the partition wall 70 may respectively correspond to one sub-pixel area.

The upper end of the partition wall 70 may be in close contact with a planarization layer 75, and its lower end may be in close contact with the upper surface of the anisotropic conductive film 50. The light dispersing layer 68 and the first color conversion layer 71 may be provided in one light emitting area partitioned by the partition wall 70, the light dispersing layer 68 and the second color conversion layer 72 may be provided in another light emitting area partitioned by the partition wall 70, and the light dispersing layer 68 and the first transparent resin layer 73 may be provided in yet another light emitting area partitioned by the partition wall 70.

Accordingly, light emitted to the side surface of the light dispersing layer 68 and the side surface of the first color conversion layer 71 corresponding to the first micro LED 61 may be reflected by the partition wall 70, and emitted to the first color filter 81. Also, light emitted to the side surface of the light dispersing layer 68 and the side surface of the second color conversion layer 72 corresponding to the second micro LED 62 may be reflected by the partition wall 70, and emitted to the second color filter 82.

The partition wall 70 may have a white color having high light reflectance to function as a reflecting body. Here, the white color may include true white and off-white. Off-white indicates all colors close to white.

The partition wall 70 may also be formed of a metallic material having high reflectance so that it can function as a reflecting body. Also, on the partition wall 70, a metal film 74 having high light reflectance may be laminated on the side surface as in FIG. 5. In this case, the partition wall 70 may be a color that is different from a white color.

The light emitting surfaces of the first to third micro LEDs 61, 62, 63 may be located at approximately the same height from the upper surface of the TFT substrate 20. Also, the light emitting surfaces of the first to third micro LEDs 61, 62, 63 may be located in positions higher than the lower end of the partition wall 70. In this case, parts of the side surfaces of the first to third micro LEDs 61, 62, 63 may face the partition wall 70. Accordingly, light emitted from the side surfaces of the first to third micro LEDs 61, 62, 63 may reflect on the partition wall 70, and emitted to the light dispersing layer 68.

As described above, the partition wall 70 may reflect light emitted from the side surfaces of the first to third micro LEDs 61, 62, 63, light emitted from the side surface of the light dispersing layer 68, light emitted from the side surfaces of the first and second color conversion layers 71, 72, and light emitted from the side surface of the third micro LED 63, and emit the light to the front surface of the display module 10, and can thereby maximize the light emitting efficiency.

Between the first and second color conversion layers 71, 72 and the first and second color filters 81, 82, the planarization layer 75 may be disposed. Also, between the first transparent resin layer 73 and the second transparent resin layer 83, the planarization layer 75 may be disposed.

The planarization layer 75 may be laminated on the first and second color filters 81, 82 and the second transparent resin layer 83 before forming the partition wall 70 when manufacturing a first portion 11 (refer to FIG. 9) of the display module 10.

The planarization layer 75 may consist of a material that does not influence the transmittance, or minimally influences, the reflectance, and the refractive index of light that passed through the first and second color conversion layers 71, 72 and the first transparent resin layer 73.

The space between the first and second color filters 81, 82 and the second transparent resin layer 83 may be partitioned by a black matrix 77 formed in a lattice shape. The shape of the black matrix 77 may be formed as a lattice shape that corresponds to the shape of the partition wall 70. In this case, the width of the black matrix 77 may be formed to be similar to the width of the partition wall 70.

On the upper side of the first and second color filters 81, 82 and the second transparent resin layer 83, a transparent cover layer 90 may be formed. The transparent cover layer 90 can prevent the pixel 100 from being polluted by a foreign substance, and can protect the pixel 100 from being damaged by an external force. To the transparent cover layer 90, a glass substrate may be applied.

In FIG. 3, only the parts wherein the partition wall 70, the planarization layer 75, the black matrix 77, and the transparent cover layer 90 correspond to one pixel unit are illustrated, but the partition wall 70, the planarization layer 75, the black matrix 77, and the transparent cover layer 90 may be formed in sizes that approximately correspond to multiple pixels across the size of the TFT substrate 20.

The sizes of the first to third micro LEDs 61, 62, 63 are respectively formed to be smaller than the size of the light dispersing layer 68. Accordingly, a gap may be formed between the side surfaces of the first to third micro LEDs 61, 62, 63 and the partition wall 70.

Referring to FIG. 6, this gap may be filled with an optical adhesive 65. The optical adhesive 65 is in close contact with each of a part 61*c* of the side surface of the first micro LED 61, a part 70*b* of the lower side surface of the partition wall 70, a part 68*b* of the bottom surface of the light dispersing layer 68, and a part 50*a* of the upper surface of the anisotropic conductive film 50. Accordingly, the partition wall 70 constitutes steadfast coupling with the surrounding structures through the optical adhesive 65, and thus it can be stably fixed on the TFT substrate 20.

As described below, the optical adhesive 65 may be used for bonding first and second portions of the display module 10 with each other.

Hereinafter, a manufacturing process of a display module according to an embodiment will be described.

Figure 7:
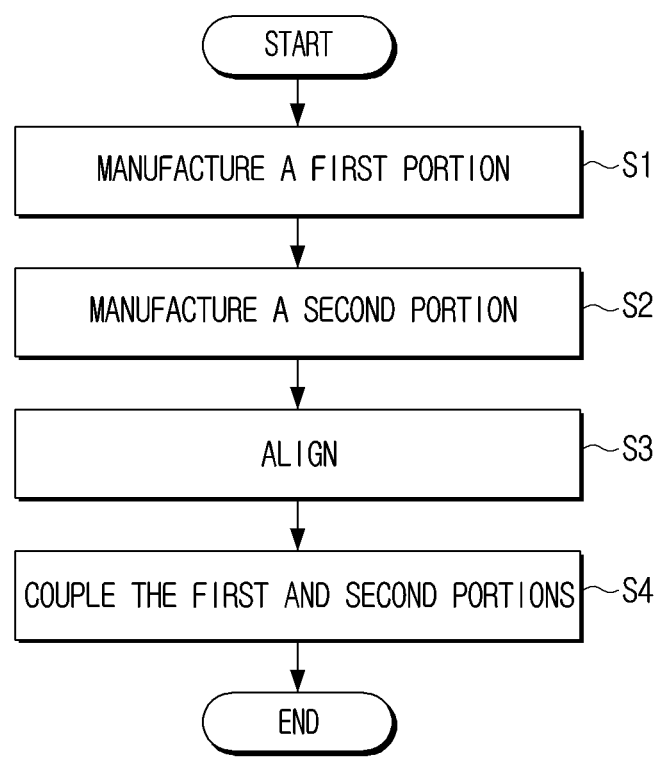
FIG. 7 is a schematic flow chart illustrating a manufacturing process of a display module according to an embodiment.

FIG. 7 is a schematic flow chart illustrating a manufacturing process of a display module according to an embodiment.

Referring to FIG. 7, a schematic overall manufacturing process of the display module 10 according to an embodiment is described as follows.

First, a first portion 11 that includes a color filter, a planarization layer, a partition wall, and a color conversion layer sequentially formed on a glass substrate, is manufactured in operation S1, and then a second portion 12 that includes a plurality of micro LEDs provided on a TFT substrate 20 is manufactured separately from the first portion 11 in operation S2.

After the second portion 12 is seated on a die, the first portion 11 may be disposed on the upper side of the second portion 12 at a specific interval.

Then, the first and second portions 11, 12 are aligned with each other in operation S3, and then the first portion 11 is pressurized to the side of the second portion 12 and the first and second portions 11, 12 are bonded with each other in operation S4.

Hereinafter, a manufacturing process of the first and second portions and a bonding process of the first and second portions of the display module 10 according to an embodiment will be sequentially described in detail with reference to the drawings.

Figure 8:
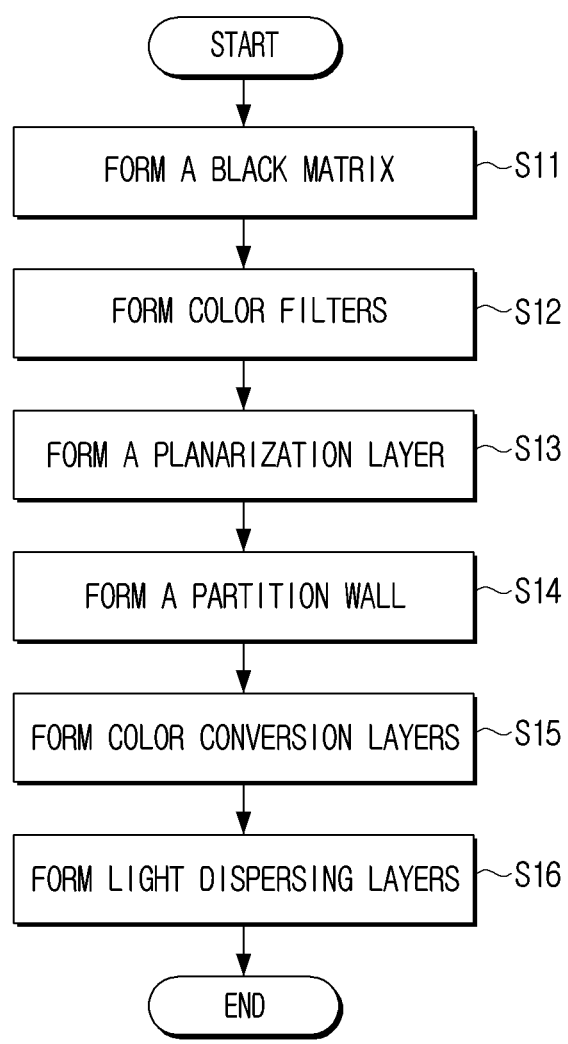
FIG. 8 is a flow chart illustrating a manufacturing process of a first portion of a display module according to an embodiment.
Figure 9:
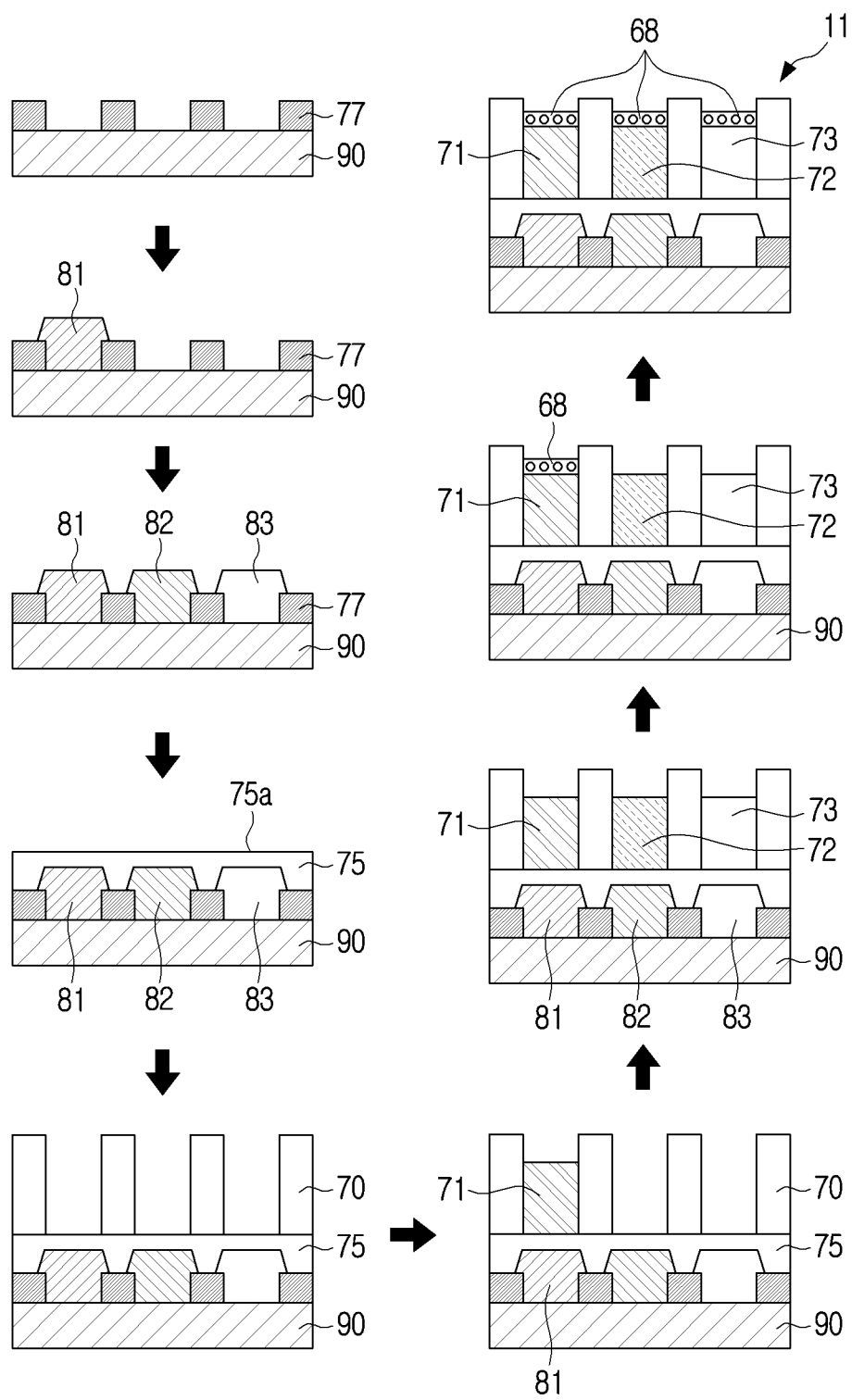
FIG. 9 is a process diagram of a first portion of a display module according to an embodiment.

FIG. 8 is a flow chart illustrating a manufacturing process of a first portion of a display module according to an embodiment, and FIG. 9 is a process diagram of a first portion of a display module according to an embodiment. In FIG. 9, the entire first portion 11 of the display module 10 is not illustrated, but a part corresponding to one pixel is illustrated in an enlarged size.

Referring to FIG. 8 and FIG. 9, the first portion 11 of the display module 10 may be manufactured.

First, a black matrix 77 is formed in a lattice shape on one surface of a transparent cover layer 90 in operation S11.

As the transparent cover layer 90, a square or rectangle glass substrate having a specific thickness may be used, for example. The size of the transparent cover layer 90 may approximately correspond to the size of the TFT substrate 20.

The black matrix 77 forms a plurality of cells as it is constituted as a lattice shape, and each cell may be a sub-pixel area. Color filters are formed in predetermined cells among the plurality of cells of the black matrix 77 in operation S12.

For example, for forming a first color filter 81, a red material is evenly applied on overall one surface of the transparent cover layer 90 wherein the black matrix 77 is formed. Then, only an area wherein the red color should remain is exposed by using a mask, and in the remaining areas, the red material is removed through development.

Then, for forming a second color filter 82, a green material is evenly applied on overall one surface of the transparent cover layer 90. Then, only an area wherein the green color should remain is exposed by using a mask, and in the remaining areas, the green material is removed through development.

Lastly, for forming a second transparent resin layer 83, a transparent resin material is evenly applied on overall one surface of the transparent cover layer 90. Then, only an area wherein the transparent resin should remain is exposed by using a mask, and in the remaining areas, the transparent resin material is removed through development.

As a method of applying a color filter material and a transparent resin material on the transparent cover layer 90, a slit method of evenly coating the material on the entire surface by using a printer nozzle, a spin method of spraying a liquid in the center, and then applying the liquid by rotating the plate, etc., may be applied.

When the first and second color filters 81, 82 and the second transparent resin layer 83 are formed, a planarization layer 75 covering the first and second color filters 81, 82 and the second transparent resin layer 83 is formed so that a partition wall 70 can be laminated on them in operation S13.

The upper surface 75a of the planarization layer 75 has flatness to a degree that the partition wall 70 can be formed of a uniform height. The planarization layer 75 may be formed of a transparent material that does not influence, or minimally influences, the transmittance, the reflectance, and the refractive index of light.

Then, the partition wall 70 in a lattice form is formed on the upper surface 75a of the planarization layer 75 in operation S14. Each cell formed by the partition wall 70 may be formed in a location corresponding to each cell formed by the aforementioned black matrix 77. In this case, each cell formed by the partition wall 70 corresponds to a sub-pixel area.

After the partition wall 70 is formed, the first color conversion layer 71 and the second color conversion layer 72 are sequentially patterned by applying a color conversion material (a nano fluorescent body or a quantum dot material) to each pixel through an inkjet printing method in operation S15.

As another method of forming the first and second color conversion layers 71, 72, the color conversion layers may be formed by mixing a nano fluorescent body or a quantum dot material with photoresist and going through application, exposure, and development, in a similar way to the aforementioned manufacturing process of a color filter.

The first color conversion layer 71 may consist of a red nano fluorescent body that can emit light of a red wavelength band, and the second color conversion layer 72 may consist of a green nano fluorescent body that can emit light of a green wavelength band. As an alternative, the first color conversion layer 71 may consist of red quantum dots, and the second color conversion layer 72 may consist of green quantum dots.

After the first and second color conversion layers 71, 72 are patterned to each pixel, a transparent resin material is patterned to empty cells wherein the first and second color conversion layers 71, 72 are not formed through an inkjet printing method, and a first transparent resin layer 73 is formed.

Then, a light dispersing layer 68 is laminated on each of the first color conversion layer 71, the second color conversion layer 72, and the first transparent resin layer 73 in operation S16.

The light dispersing layer 68 may be a material wherein a light dispersing material is mixed with a transparent resin. The light dispersing layer 68 may also be formed by patterning through an inkjet printing method or applying a material forming the light dispersing layer 68 on the overall upper side of the first portion 11, and then going through exposure and development.

Through the process as above, the first portion 11 constituting the upper plate of the display module 10 may be formed.

Figure 10:
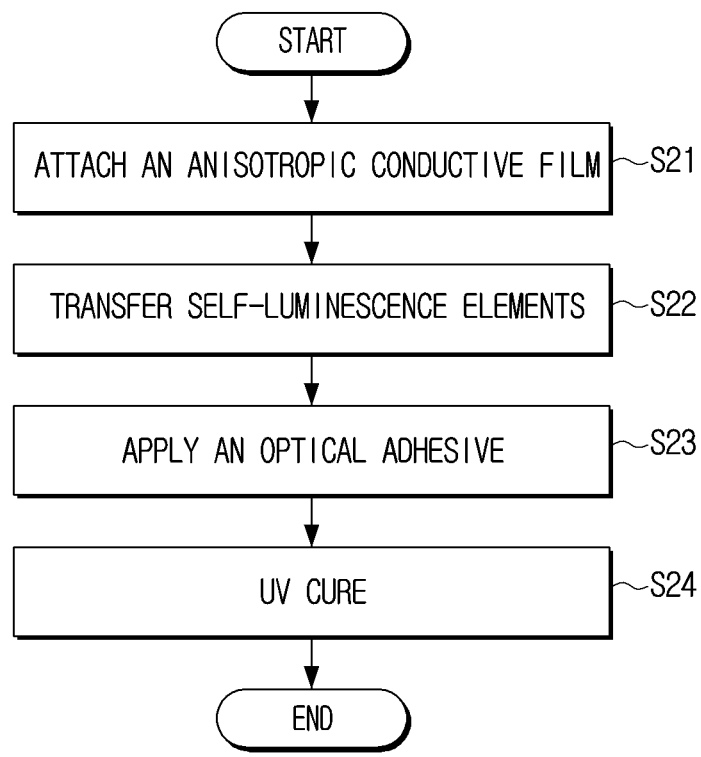
FIG. 10 is a flow chart illustrating a manufacturing process of a second portion of a display module according to an embodiment.
Figure 11:
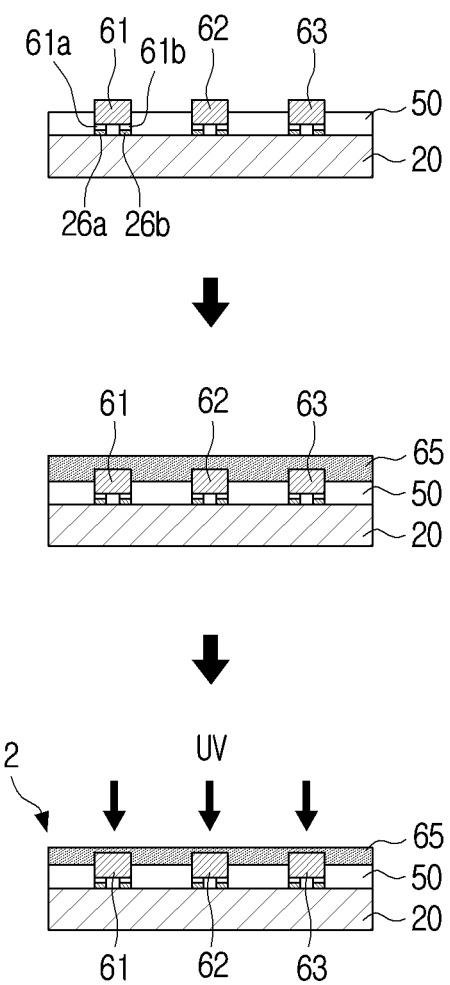
FIG. 11 is a process diagram of a second portion of a display module according to an embodiment.

FIG. 10 is a flow chart illustrating a manufacturing process of a second portion of a display module according to an embodiment, and FIG. 11 is a process diagram of a second portion of a display module according to an embodiment. In FIG. 11, the entire second portion 12 of the display module 10 is not illustrated, but a part corresponding to one pixel is illustrated in an enlarged size.

Referring to FIG. 10 and FIG. 11, an anisotropic conductive film 50 is laminated on the front surface of the TFT substrate 20 in operation S21.

In this case, on the front surface of the TFT substrate 20, a plurality of substrate electrode pads 26a, 26b are arranged at specific intervals.

After the anisotropic conductive film 50 is attached on the TFT substrate 20, a plurality of micro LEDs are transferred to the TFT substrate 20 in operation S22.

The transfer process of micro LEDs may be performed through a laser transfer method, a rollable transfer method, a pick and place transfer method, etc. In this case, the first to third micro LEDs 61, 62, 63 are respectively transported from an epi substrate to a relay substrate (or an interposer), and are then transferred from each relay substrate to the TFT substrate 20 which is the target substrate.

When the first to third micro LEDs 61, 62, 63 are transferred to the TFT substrate 20, they are seated on the surface of the anisotropic conductive film 50 attached on the TFT substrate 20. In this state, the first to third micro LEDs 61, 62, 63 are inserted into the inside of the anisotropic conductive film 50 to a predetermined depth through a thermo-compressing process. Accordingly, the first to third micro LEDs 61, 62, 63 are physically fixed on the TFT substrate 20. Also, chip electrodes of each micro LED 61, 62, 63 may be electronically connected with corresponding substrate electrode pads by a plurality of conductive balls 51 distributed inside the anisotropic conductive film 50.

The first to third micro LEDs 61, 62, 63 may be blue micro LEDs that emit light of a blue wavelength band.

Then, an optical adhesive 65 for bonding the first portion 11 and the second portion 12 is applied on the front surface of the TFT substrate 20 in operation S23.

The optical adhesive 65 is applied on the TFT substrate 20 so that it can cover all of the plurality of micro LEDs 61, 62, 63. The optical adhesive 65 may be UV-curable silicone rubber (i.e., di-methyl siloxane) that has a characteristic of being cured after a specific time after exposure to UV.

Then, UV light may be radiated to the optical adhesive 65 for a predetermined time to cure the optical adhesive 65 in operation S24.

Through the process as above, the second portion 12 constituting the lower plate of the display module 10 may be formed.

Hereinafter, a process of manufacturing the display module 10 by bonding the first portion 11 and the second portion 12 with each other will be described.

Figure 12:
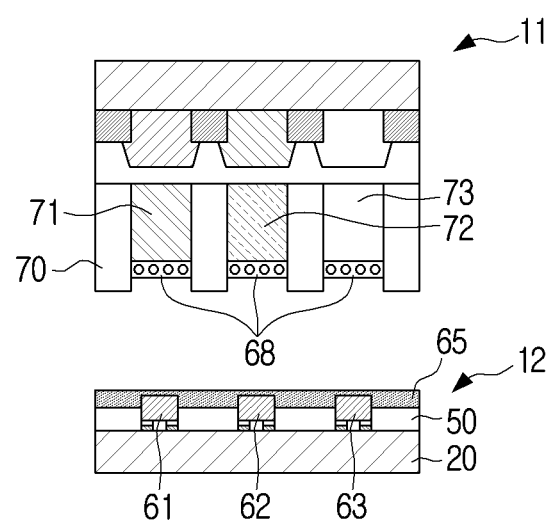
FIG. 12 is a process diagram wherein the first portion and the second portion of a display module according to an embodiment are coupled.
Figure 12:
Figure 12:
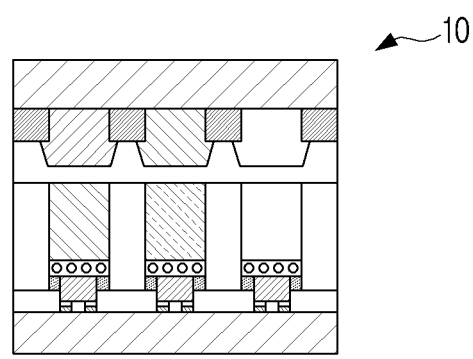

FIG. 12 is a process diagram wherein the first portion and the second portion of a display module according to an embodiment are coupled.

Referring to FIG. 12, after the second portion 12 is seated on a die, the first portion 11 is disposed on the upper side of the second portion 12 at a specific interval.

Then, the first portion 11 is reversed for bonding the first and second portions 11, 12 with each other, and the first portion 11 is aligned in a bonding position such that the light dispersing layer 68 of the first portion 11 corresponds to the first to third micro LEDs 61, 62, 63 of the second portion 12.

In this case, it is preferable that the first and second portions 11, 12 are disposed to be maintained parallel with each other for the same plane.

After the first and second portions 11, 12 are aligned in a bonding position, the first portion 11 is adhered to the second portion 12 by applying a predetermined pressure, and the first and second portions 11, 12 are bonded. In this case, the first and second portions 11, 12 are attached to each other by the optical adhesive 65.

After the first and second portions 11, 12 are bonded, the optical adhesive 65 may be cured, and the coupling between the first and second portions 11, 12 can thereby be made steadfast.

Through the process as above, the display module 10 according to an embodiment may be manufactured.

Hereinafter, a display module according to another embodiment will be described.

To the aforementioned display module 10 according to an embodiment, blue micro LEDs were implemented as self-luminescence elements for displaying images, but embodiments are not limited thereto. For example, a display module 10a (refer to FIG. 13) according to an embodiment includes UV micro LEDs implemented as self-luminescence elements for displaying images.

Figure 13:
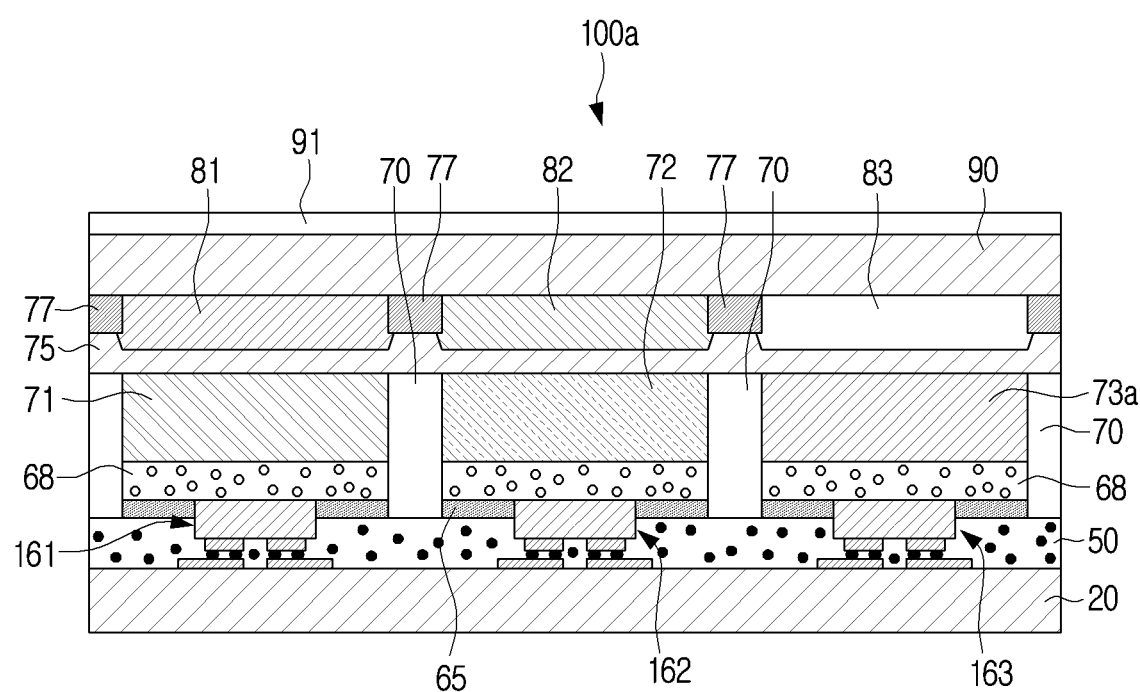
FIG. 13 is a cross-sectional view illustrating a single pixel of a display module according to an embodiment.

FIG. 13 is a cross-sectional view illustrating a single pixel of a display module according to an embodiment.

In describing the display module according to an embodiment, regarding the same components as the aforementioned display module 10, the same reference numerals will be granted and explanation in that regard will be omitted, and explanation will be made focused on components different from the aforementioned display module 10.

In the display module 10a, a TFT substrate 20 is included, and on the TFT substrate 20, a plurality of pixels 100a are arranged.

Referring to FIG. 13, the pixels 100a of the display module 10a include first to third ultraviolet (UV) micro light emitting diodes (LEDs) that emit light of an ultraviolet wavelength band (360-410 nm).

On each of the light emitting surfaces of the first to third UV micro LEDs 161, 162, 163, a light dispersing layer 68 may be disposed.

First to third color conversion layers 71, 72, 73a may be laminated on the light dispersing layers 68 respectively corresponding to the first to third UV micro LEDs 161, 162, 163.

The first to third color conversion layers 71, 72, 73a may include nano fluorescent bodies that absorb light emitted from the light dispersing layers 68, and convert the light into light of different wavelength bands from one another and emit the converted light.

The first color conversion layer 71 may include a red nano fluorescent body that is excited by light of an ultraviolet wavelength band emitted from the first UV micro LED 161, and can emit light of a red wavelength band. For example, the red nano fluorescent body may be $SCASN(Si_{1-x}Ca_{x}AlSiN_3:Eu^{2+})$. In this case, the particle size distribution average value (d50) of the red nano fluorescent body may be smaller than 0.5 μm (preferably, 0.1 μm<d50<0.5 μm).

The second color conversion layer 72 may include a green nano fluorescent body that is excited by light of an ultraviolet wavelength band emitted from the second UV micro LED 162, and can emit light of a green wavelength band. For example, the green nano fluorescent body may be β-SiAlON($Si_{6-z}Al_zO_zN_{8-z}:Eu^{2+}$) or SrGa2S4. In this case, the particle size distribution average value (d50) of the green nano fluorescent body may be smaller than 0.5 μm (preferably, 0.1 μm<d50<0.5 μm).

The third color conversion layer 73a may include a blue nano fluorescent body that is excited by light of an ultraviolet wavelength band emitted from the third UV micro LED 163, and can emit light of a blue wavelength band. For example, the blue nano fluorescent body may be BAM ($BaMg_xAl_yO_z:Eu^{n+}$). In this case, the particle size distribution average value (d50) of the blue nano fluorescent body may be smaller than 0.5 μm (preferably, 0.1 μm<d50<0.5 μm).

As an alternative, the first color conversion layer 71 may consist of red quantum dots, the second color conversion layer 72 may consist of green quantum dots, and the third color conversion layer 73a may consist of blue quantum dots.

On the upper side of the first to third color conversion layers 71, 72, 73a, a first color filter 81, a second color filter 82, and a second transparent resin layer 83 may be respectively disposed.

The sizes of the first to third UV micro LEDs 161, 162, 163 are respectively formed to be smaller than the size of the light dispersing layer 68. In this case, the size of the light dispersing layer 68 may be identical to the sizes (or areas) of the first to third color conversion layers 71, 72, 73a. Accordingly, a gap may be formed between the side surfaces of the first to third UV micro LEDs 161, 162, 163 and the partition wall 70, and this gap is filled with an optical adhesive 65. Accordingly, the partition wall 70 constitutes steadfast coupling with the surrounding structures through the optical adhesive 65, and thus it can be stably fixed on the TFT substrate 20.

Also, on one surface of the transparent cover layer 90, a UV block filter 91 of a thin film may be laminated. The UV block filter 91 may block ultraviolet lays emitted from the first to third UV micro LEDs 161, 162, 163. The UV block filter 91 may have transmittance of equal to or smaller than 10% for wavelengths of equal to or smaller than 400 nm.

Hereinafter, a manufacturing process of the first and second portions and a bonding process of the first and second portions of the display module 10a according to an embodiment will be sequentially described in detail with reference to the drawings.

Figure 14:
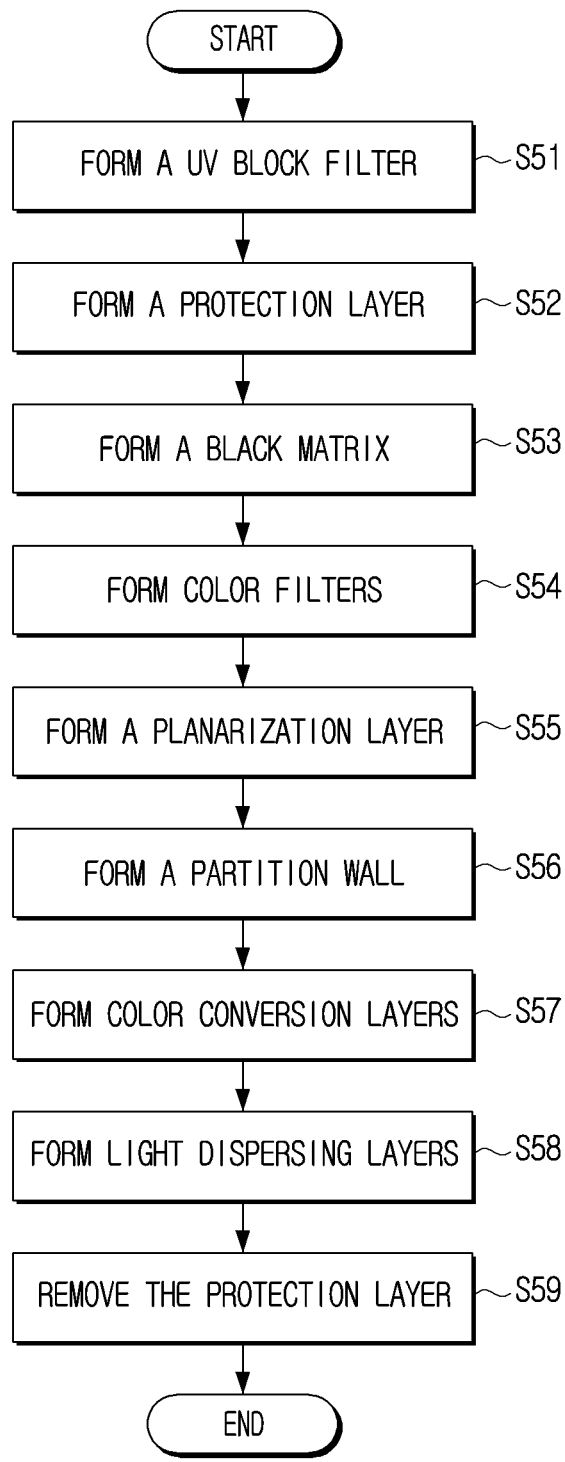
FIG. 14 is a flow chart illustrating a manufacturing process of a first portion of a display module according to an embodiment.
Figure 15:
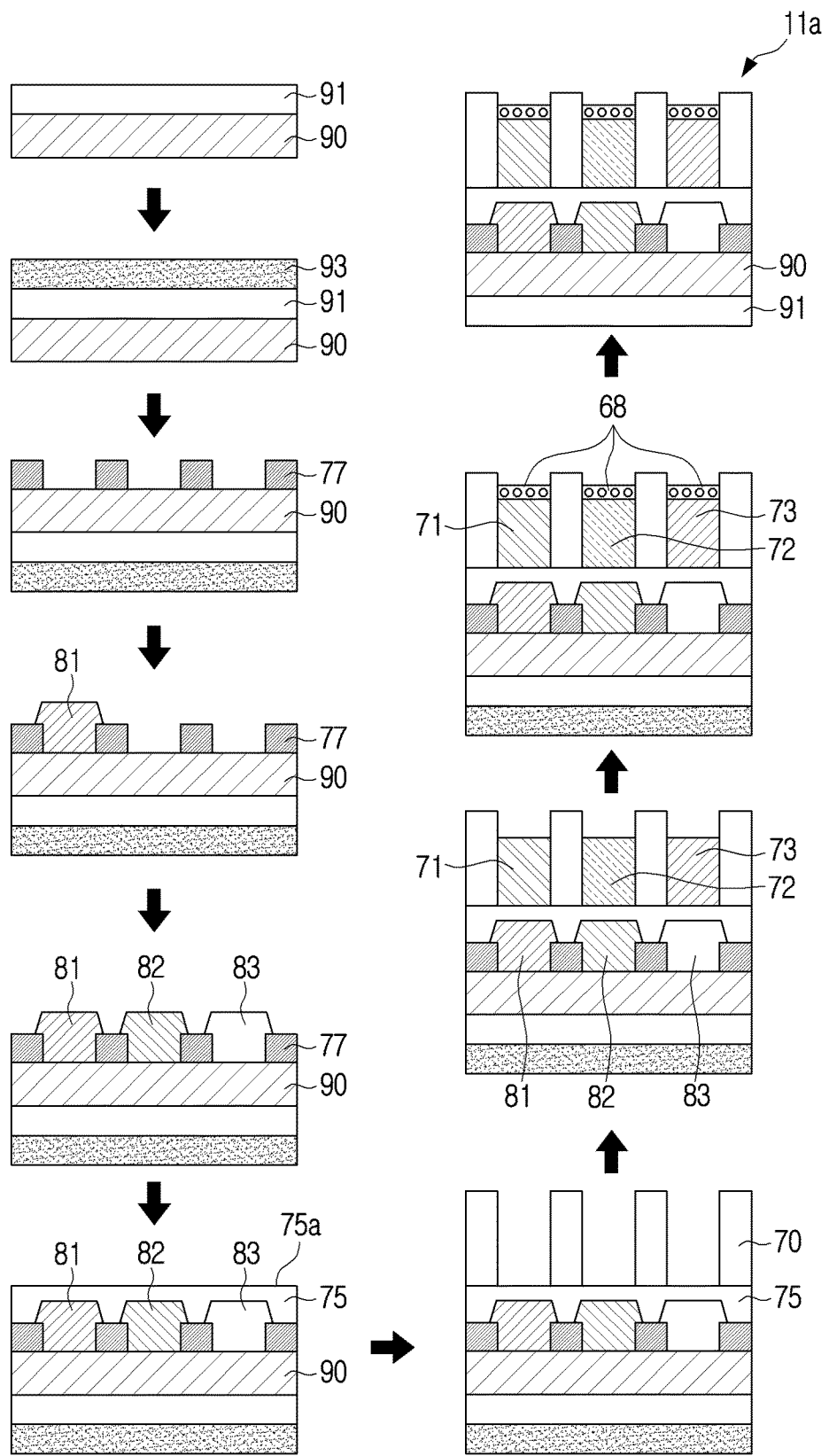
FIG. 15 is a process diagram of a first portion of a display module according to an embodiment.

FIG. 14 is a flow chart illustrating a manufacturing process of a first portion of a display module according to an embodiment, and FIG. 15 is a process diagram of a first portion of a display module according to an embodiment. In FIG. 14, the entire first portion 11a of the display module 10a is not illustrated, but a part corresponding to one pixel is illustrated in an enlarged size.

Referring to FIG. 14 and FIG. 15, the first portion 11a of the display module 10a may be manufactured.

First, a UV block filter 91 of a thin film is formed on one surface of the transparent cover layer 90 in operation S51. The UV block filter 91 may block ultraviolet rays emitted from the first to third UV micro LEDs 161, 162, 163.

While the first portion 11a is manufactured, a protection layer 93 is laminated on the UV block filter 91 for protecting the UV block filter 91 in operation S52.

Then, a black matrix 77 is formed in the form of a lattice on the other surface of the transparent cover layer 90 in operation S53.

As the transparent cover layer 90, a square or rectangle glass substrate having a specific thickness may be used, for example. The size of the transparent cover layer 90 may approximately correspond to the size of the TFT substrate 20.

The black matrix 77 forms a plurality of cells as it is constituted as a lattice shape, and each cell may be a sub-pixel area. Like this, a color filter is formed in a predetermined cell among the plurality of cells of the black matrix 77 in operation S54.

For example, for forming a first color filter 81, a red material is evenly applied on overall one surface of the transparent cover layer 90 wherein the black matrix 77 is formed. Then, only an area wherein the red color should remain is exposed by using a mask, and in the remaining areas, the red material is removed through development.

Then, for forming a second color filter 82, a green material is evenly applied on overall one surface of the transparent cover layer 90. Then, only an area wherein the green color should remain is exposed by using a mask, and in the remaining areas, the green material is removed through development.

Also, for forming a second transparent resin layer 83, a transparent resin material is evenly applied on overall one surface of the transparent cover layer 90. Then, only an area wherein the transparent resin should remain is exposed by using a mask, and in the remaining areas, the transparent resin material is removed through development.

As a method of applying a color filter material and a transparent resin material on the transparent cover layer 90, a slit method of evenly coating the material on the entire surface by using a printer nozzle, a spin method of spraying a liquid in the center, and then applying the liquid by rotating the plate, etc., may be applied.

When the first and second color filters 81, 82 and the second transparent resin layer 83 are formed, a planarization layer 75 covering the first and second color filters 81, 82 and the second transparent resin layer 83 is formed so that a partition wall 70 can be laminated on them in operation S55.

The upper surface 75a of the planarization layer 75 has flatness to a degree that the partition wall 70 can be formed of a uniform height. The planarization layer 75 may be formed of a transparent material that does not influence, or minimally influences, the transmittance, the reflectance, and the refractive index of light.

Then, the partition wall 70 in a lattice form is formed on the upper surface 75a of the planarization layer 75 in operation S56. Each cell formed by the partition wall 70 may be formed in a location corresponding to each cell formed by the aforementioned black matrix 77. In this case, each cell formed by the partition wall 70 corresponds to a sub-pixel area.

After the partition wall 70 is formed, the first to third color conversion layers 71, 72, 73a are sequentially patterned by applying a color conversion material (a nano fluorescent body) to each cell through an inkjet printing method in operation S57.

As another method of forming the first to third color conversion layers 71, 72, 73a, the color conversion layers may be formed by applying, exposing, and developing photoresist mixed with a nano fluorescent body in a similar way to the aforementioned manufacturing process of a color filter.

The first color conversion layer 71 may consist of a red nano fluorescent body that can emit light of a red wavelength band, and the second color conversion layer 72 may consist of a green nano fluorescent body that can emit light of a green wavelength band. Also, the third color conversion layer 73a may consist of a blue nano fluorescent body that can emit light of a blue wavelength band.

Then, light dispersing layer 68 may be laminated on each of the first color conversion layer 71, the second color conversion layer 72, and the third color conversion layer 73a in operation S58.

The light dispersing layer 68 may be a material wherein light dispersing material is mixed with a transparent resin. The light dispersing layer 68 may also be formed by patterning through an inkjet printing method or applying a material forming the light dispersing layer 68 on the overall upper side of the first portion 11, and then going through exposure and development.

Then, the protection layer 93 is removed from the UV block filter 91 in operation S59. Through the process as above, the first portion 11a constituting the upper plate of the display module 10a may be formed.

Figure 16:
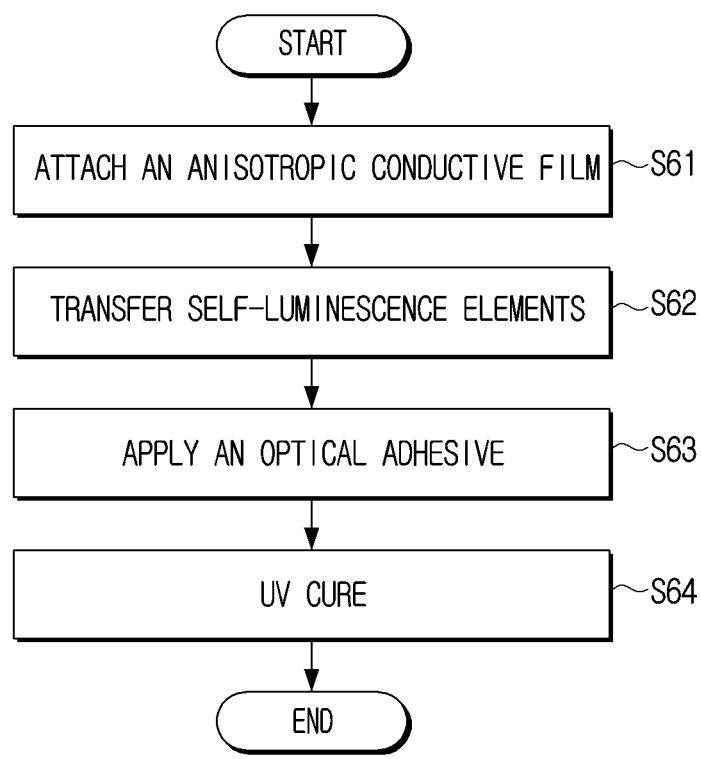
FIG. 16 is a flow chart illustrating a manufacturing process of a second portion of a display module according to an embodiment.
Figure 17:
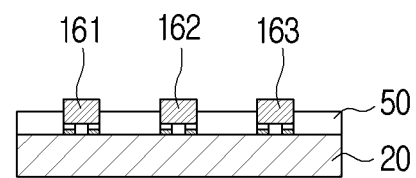
FIG. 17 is a process diagram of a second portion of a display module according to an embodiment.
Figure 17:
Figure 17:
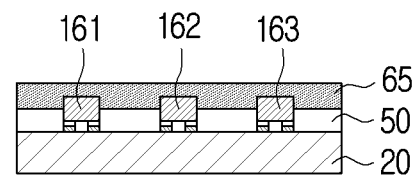
Figure 17:
Figure 17:
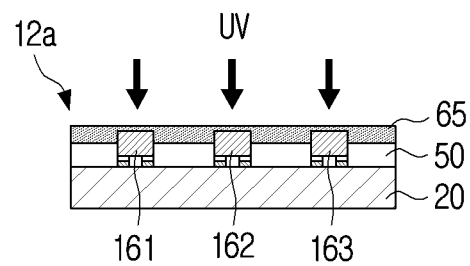

FIG. 16 is a flow chart illustrating a manufacturing process of a second portion of a display module according to an embodiment, and FIG. 17 is a process diagram of the second portion of a display module according to an embodiment. In FIG. 17, the entire second portion 12a of the display module 10a is not illustrated, but a part corresponding to one pixel is illustrated in an enlarged size.

Referring to FIG. 16 and FIG. 17, an anisotropic conductive film 50 is laminated on the front surface of the TFT substrate 20 in operation S61. In this case, on the front surface of the TFT substrate 20, a plurality of substrate electrode pads 26a, 26b are arranged at specific intervals.

After the anisotropic conductive film 50 is attached on the TFT substrate 20, a plurality of UV micro LEDs 161, 162, 163 are transferred to the TFT substrate 20 in operation S62.

The transfer process of UV micro LEDs may be performed through a laser transfer method, a rollable transfer method, a pick and place transfer method, etc. In this case, the first to third UV micro LEDs 161, 162, 163 are respectively transported from an epi substrate to a relay substrate (or an interposer), and are then transferred from each relay substrate to the TFT substrate 20 which is the target substrate.

When the first to third UV micro LEDs 161, 162, 163 are transferred to the TFT substrate 20, they are seated on the surface of the anisotropic conductive film 50 attached on the TFT substrate 20. In this state, the first to third UV micro LEDs 161, 162, 163 are inserted into the inside of the anisotropic conductive film 50 to a predetermined depth through a thermo-compressing process. Accordingly, the first to third UV micro LEDs 161, 162, 163 are physically fixed on the TFT substrate 20. Also, chip electrodes of each UV micro LED 161, 162, 163 may be electronically connected with corresponding substrate electrode pads by a plurality of conductive balls 51 distributed inside the anisotropic conductive film 50.

Then, an optical adhesive 65 for bonding the first portion 11a and the second portion 12a is applied on the front surface of the TFT substrate 20 in operation S63.

The optical adhesive 65 is applied on the TFT substrate 20 so that it can cover all of the plurality of UV micro LEDs 161, 162, 163. The optical adhesive 65 may be UV-curable silicone rubber (e.g., di-methyl siloxane) that has a characteristic of being cured after a specific time after exposure to UV.

Then, UV light may be radiated to the optical adhesive 65 for a predetermined time to cure the optical adhesive 65 in operation S64.

Through the process as above, the second portion 12a constituting the lower plate of the display module 10a may be formed.

Hereinafter, a process of manufacturing the display module 10a by bonding the first portion 11a and the second portion 12a with each other will be described.

Figure 18:
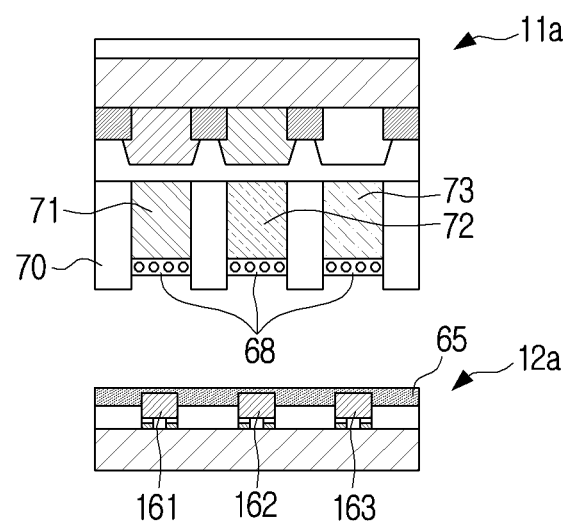
FIG. 18 is a process diagram wherein the first portion and the second portion of a display module according to an embodiment are coupled.
Figure 18:
Figure 18:
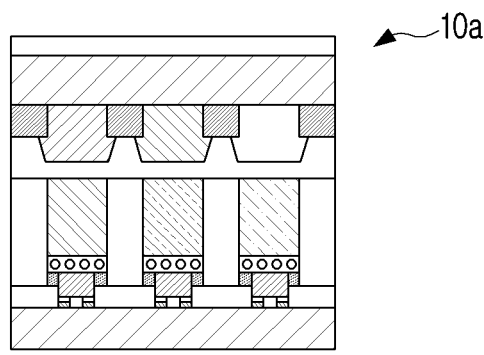

FIG. 18 is a process diagram wherein the first portion and the second portion of a display module according to an embodiment are coupled.

Referring to FIG. 18, after the second portion 12a is seated on a die, the first portion 11a is disposed on the upper side of the second portion 12a at a specific interval.

Then, the first portion 11a is reversed for bonding the first and second portions 11a, 12a with each other, and the first portion 11a is aligned in a bonding position such that the light dispersing layer 68 of the first portion 11a corresponds to each UV micro LED 161, 162, 163 of the second portion 12a.

In this case, it is preferable that the first and second portions 11a, 12a are disposed to be maintained parallel with each other for the same plane.

After the first and second portions 11a, 12a are aligned in a bonding position, the first portion 11a is made to adhere to the second portion 12a by predetermined pressure, and the first and second portions 11a, 12a are bonded. In this case, the first and second portions 11a, 12a are attached to each other by the optical adhesive 65.

After the first and second portions 11a, 12a are bonded, the optical adhesive 65 may be cured, and the coupling between the first and second portions 11a, 12a can thereby be made steadfast.

Through the process as above, the display module 10a according to an embodiment may be manufactured.

Embodiments have been described separately from one another, but each embodiment does not have to be implemented independently, and the configuration and operation of each embodiment may be implemented in combination with at least one other embodiment.

While embodiments have been particularly shown and described, it will be understood that various changes in form and details may be made therein without departing from the spirit and scope of the following claims.

INDUSTRIAL APPLICABILITY

The disclosure relates to a display module that uses self-luminescence elements for displaying images, and a method for manufacturing thereof.

What is claimed is:

1. A display module comprising:
    a substrate; and
    a plurality of pixels provided on the substrate,
    wherein a first pixel of the plurality of pixels comprises:
        a first inorganic light emitting element, a second inorganic light emitting element and a third inorganic light emitting element, each of the first inorganic light emitting element, the second inorganic light emitting element and the third inorganic light emitting element being configured to emit light of a same color;
        a first light dispersing layer provided on a light emitting surface of the first inorganic light emitting element, a second light dispersing layer provided on a light emitting surface of the second inorganic light emitting element and a third light dispersing layer provided on a light emitting surface of the third inorganic light emitting element;
        a first color conversion layer provided on the first light dispersing layer and a second color conversion layer provided on the second light dispersing layer; and
        a first color filter provided on the first color conversion layer and a second color filter provided on the second color conversion layer,
    a partition wall between the first inorganic light emitting element, the second inorganic light emitting element and the third inorganic light emitting element; and
    an optical adhesive provided between a side surface of the first inorganic light emitting element and the partition wall, between a side surface of the second inorganic light emitting element and the partition wall, and between the third inorganic light emitting element and the partition wall,
    wherein the optical adhesive is in direct contact with each of a part of a side surface of the first inorganic light emitting element, a part of a lower side surface of the partition wall, and a part of a bottom surface of the first light dispersing layer,
    wherein the optical adhesive is further in direct contact with each of a part of a side surface of the second inorganic light emitting element, a part of a lower side surface of the partition wall, and a part of a bottom surface of the second light dispersing layer, and
    wherein optical adhesive is further in direct contact with each of a part of a side surface of the third inorganic light emitting element, a part of a lower side surface of the partition wall, and a part of a bottom surface of the third light dispersing layer.

2. The display module as claimed in claim 1, wherein when viewed from above the upper surface of the substrate, the first light dispersing layer and the first color conversion layer have a same size, and the second light dispersing layer and the second color conversion layer have a same size.

3. The display module as claimed in claim 1, wherein each of the first light dispersing layer, the second light dispersing layer and the third light dispersing layer comprises a light scattering material mixed with a transparent resin.

4. The display module as claimed in claim 3, wherein the transparent resin is a silicone or an epoxy-based compound.

5. The display module as claimed in claim 3, wherein the light scattering material is $TiO_2$, $SiO_2$ or a glass bead.

6. The display module as claimed in claim 1, wherein when viewed from above the upper surface of the substrate, a center of the first inorganic light emitting element corresponds to a center of the first light dispersing layer, a center of the second inorganic light emitting element corresponds to a center of the second light dispersing layer, and a center of the third inorganic light emitting element corresponds to a center of the third light dispersing layer.

7. The display module as claimed in claim 1, wherein when viewed from above the upper surface of the substrate, a center of the first inorganic light emitting element is offset from a center of the first light dispersing layer, a center of the second inorganic light emitting element is offset from a center of the second light dispersing layer and a center of the third inorganic light emitting element is offset from a center of the third light dispersing layer.

8. The display module as claimed in claim 1, wherein each of the first inorganic light emitting element, the second inorganic light emitting element and the third inorganic light emitting element is a Blue Micro Light Emitting Diode (LED).

9. The display module as claimed in claim 1, wherein when viewed from above the upper surface of the substrate, the first light dispersing layer and the first color conversion layer have a same size, and the second light dispersing layer and the second color conversion layer have a same size, and
wherein the partition wall is configured to reflect light emitted from each of the first light dispersing layer, the second light dispersing layer and the third light dispersing layer, and from a side surface of each of the first color conversion layer and the second color conversion layer.

10. The display module as claimed in claim 9, wherein a metal film is formed on a surface of the partition wall.

11. The display module as claimed in claim 1, wherein each of the first inorganic light emitting element, the second inorganic light emitting element and the third inorganic light emitting element is an Ultraviolet Micro Light Emitting Diodes (UV LEDs), and
wherein the display module further comprises:
a third color conversion layer provided on the third light dispersing layer;
a third color filter provided on the third color conversion layer; and
an Ultraviolet (UV) block filter provided on the first color filter, the second color filter and the third color filter.

12. A display device comprising:
a substrate; and
a plurality of pixels provided on an upper surface of the substrate,
wherein a first pixel of the plurality of pixels comprise:
a first light emitting element configured to emit light of a first color;
a first light dispersing layer provided on the first light emitting element;
a first color conversion layer provided on the first light dispersing layer;
a second light emitting element configured to emit light of the first color;
a second light dispersing layer provided on the second light emitting element;
a second color conversion layer provided on the second light dispersing layer;
a partition wall between the first light emitting element and the second light emitting element; and
an optical adhesive provided between a side surface of the first light emitting element and the partition wall, between a side surface of the second light emitting element and the partition wall, and between the first light dispersing layer and the substrate,
wherein a sidewall of the first light dispersing layer and a sidewall of the first color conversion layer are coplanar,
wherein a sidewall of the second light dispersing layer and a sidewall of the second color conversion layer are coplanar,
wherein the optical adhesive is in direct contact with each of a part of a side surface of the first light emitting element, a part of a lower side surface of the partition wall, and a part of a bottom surface of the first light dispersing layer, and
wherein the optical adhesive is further in direct contact with each of a part of a side surface of the second light emitting element, a part of a lower side surface of the partition wall, and a part of a bottom surface of the second light dispersing layer.

13. The display device as claimed in claim 12, wherein the partition wall is further provided between the first light dispersing layer and the second light dispersing layer, and between the first color conversion layer and the second conversion layer.

14. The display device as claimed in claim 13, wherein a first sidewall of the partition wall directly contacts the sidewall of the first light dispersing layer and the sidewall of the first color conversion layer, and wherein a second sidewall of the partition wall directly contacts the sidewall of the second light dispersing layer and the sidewall of the second color conversion layer.

15. The display device as claimed in claim 13, wherein a metal film is provided on a sidewall of the partition wall, and
wherein the metal film directly contacts the sidewall of the first light dispersing layer and the sidewall of the first color conversion layer.

* * * * *